US006463560B1

(12) United States Patent
Bhawmik et al.

(10) Patent No.: US 6,463,560 B1
(45) Date of Patent: Oct. 8, 2002

(54) METHOD FOR IMPLEMENTING A BIST SCHEME INTO INTEGRATED CIRCUITS FOR TESTING RTL CONTROLLER-DATA PATHS IN THE INTEGRATED CIRCUITS

(75) Inventors: Sudipta Bhawmik, Monmouth Junction, NJ (US); Indradeep Ghosh, Sunnyvale, CA (US); Niraj Jha, Princeton, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/338,338

(22) Filed: Jun. 23, 1999

(51) Int. Cl.[7] .............................................. G01R 31/87
(52) U.S. Cl. ...................................................... 714/733
(58) Field of Search ................................ 714/724–726, 714/733–734

(56) References Cited

U.S. PATENT DOCUMENTS

| 5,513,123 | A | * | 4/1996 | Dey et al. ....................... 716/4 |
| 5,731,983 | A | * | 3/1998 | Balakrishnan et al. ......... 716/18 |
| 5,748,647 | A | * | 5/1998 | Bhattacharya et al. ...... 714/726 |
| 6,237,121 | B1 | * | 5/2001 | Yadavalli et al. ........... 714/726 |

OTHER PUBLICATIONS

"Sequential Test Generation and Synthesis for Testability at the Register Transfer and Logic Levels" IEEE Transactions on Computer–Aided Design of Integrated Circuits and Systems, May 1993 pp 579–598, by Gosh et al.*
"An improved Method for RTL Synthesis with Testability Tradeoffs" Procedures of the International Conference on Computer Aided Design Nov. 1993 pp. 30–35, by Harmanani et al.*
"Transformations and Resynthesis for Testability of RT–Level Control–Data Path Specifications" IEEE Transactions on VLSI Systems Sep. 1993 pp. 304–318, by Bhattacharya et al.*

* cited by examiner

Primary Examiner—Albert Decady
Assistant Examiner—Cynthia R. Harris
(74) Attorney, Agent, or Firm—Cohen, Pontani, Lieberman & Pavane

(57) ABSTRACT

A method for testing a controller-data path RTL circuit using a BIST scheme without imposing any major design restrictions on the circuit. A state table is extracted from the controller netlist of the circuit using a state machine extraction program. The untested RTL elements/modules in the circuit are then selected, and the test control and data flow (TCDF) of the circuit are extracted from the controller/data path. Once the TCDF is extracted for the selected RTL elements, a symbolic testability analysis (STA) is performed to obtain test environments for as many untested data path elements as possible. The controller input sequence at the select signals of these test multiplexers needed for the particular test environment is noted and/or stored. A BIST controller is synthesized from the stored input sequences and the circuit is integrated with the BIST components using the thereby determined BIST architecture.

8 Claims, 20 Drawing Sheets

TSENg

Binding information:

| | |
|---|---|
| Inputs: i1, i2, i3 | ADD1: +1, +3 |
| Outputs: o1, o2 | ADD2: +2 |
| REG1: c1, o1, v3, v6 | ADD3: +4 |
| REG2: v1, v5 | MUL1: *1 |
| REG3: c2, o2 | SUB1: −1 |
| REG4: i3, v2, v4 | OR1: \|1 |
| REG5: i1 | AND1: &1 |
| REG6: i2 | |

Barcode

FIG. 8

| | INPUTS | | | | | | | STATE | | OUTPUTS | | | | | | | | | | | | | | | |
|---|---|---|---|---|---|---|---|---|---|---|---|---|---|---|---|---|---|---|---|---|---|---|---|---|---|---|
| Reset | Start | Scan | Video | O1 | O2 | O3 | inflag | PS | NS | 11 | 12 | 13 | 14 | 15 | m1 | m2 | m3 | m4 | m5 | m6 | m7 | Eoc | Memw | flag | chflag |
| 1 | x | x | x | x | x | x | x | ANY | S0 | 0 | 0 | 0 | 0 | 0 | 0 | 0 | 0 | 0 | 0 | 0 | 0 | 0 | 0 | 0 | 0 |
| 0 | 0 | x | x | x | x | x | x | S0 | S0 | 0 | 0 | 0 | 1 | 1 | 0 | 0 | 0 | 1 | 0 | 1 | 0 | 0 | 0 | 0 | 0 |
| 0 | 1 | x | x | x | x | x | x | S0 | S2 | 0 | 0 | 0 | 1 | 1 | 0 | 0 | 0 | 1 | 0 | 1 | 0 | 0 | 0 | 0 | 0 |
| 0 | x | 1 | x | x | x | x | x | S2 | S3 | 1 | 1 | 1 | 0 | 0 | 1 | 1 | 1 | 0 | 0 | 0 | 0 | 0 | 1 | 1 | 1 |
| 0 | x | 0 | x | x | x | x | x | S2 | S2 | 0 | 0 | 0 | 0 | 0 | 0 | 0 | 0 | 0 | 0 | 0 | 0 | 0 | 0 | 0 | 0 |
| 0 | x | x | 1 | x | x | x | 0 | S2 | S4 | 0 | 0 | 1 | 0 | 0 | 0 | 0 | 0 | 0 | 0 | 0 | 1 | 0 | 0 | 0 | 0 |
| 0 | x | x | 1 | x | x | x | 1 | S3 | S4 | 0 | 0 | 0 | 0 | 0 | 0 | 0 | 0 | 0 | 0 | 0 | 1 | 0 | 0 | 0 | 0 |
| 0 | x | x | 0 | x | x | x | 0 | S3 | S5 | 0 | 0 | 1 | 0 | 0 | 0 | 0 | 0 | 0 | 0 | 0 | 0 | 0 | 0 | 0 | 0 |
| 0 | x | x | 0 | x | x | x | 1 | S3 | S5 | 0 | 0 | 0 | 0 | 0 | 0 | 0 | 0 | 0 | 0 | 0 | 0 | 0 | 0 | 0 | 0 |
| 0 | x | x | x | 0 | 1 | 1 | x | S4 | S2 | 0 | 0 | 0 | 1 | 1 | 1 | 1 | 0 | 0 | 0 | 0 | 0 | 0 | 1 | 1 | 1 |
| 0 | x | x | x | 0 | 0 | 1 | x | S4 | S2 | 0 | 0 | 0 | 1 | 1 | 1 | 1 | 0 | 0 | 0 | 0 | 0 | 0 | 1 | 1 | 1 |
| 0 | x | x | x | 1 | 1 | x | x | S4 | S2 | 0 | 0 | 0 | 1 | 1 | 1 | 1 | 0 | 0 | 0 | 0 | 0 | 0 | 1 | 1 | 1 |
| 0 | x | x | x | 1 | 0 | 0 | x | S4 | S6 | 1 | 1 | 0 | 1 | 1 | 1 | 0 | 0 | 0 | 0 | 0 | 0 | 1 | 0 | 0 | 1 |
| 0 | x | x | x | x | 1 | x | x | S4 | S3 | 0 | 0 | 0 | 0 | 0 | 0 | 0 | 0 | 0 | 0 | 0 | 0 | 0 | 0 | 0 | 1 |
| 0 | x | x | x | 0 | 0 | 1 | x | S5 | S2 | 0 | 0 | 0 | 0 | 0 | 0 | 0 | 0 | 0 | 1 | 0 | 0 | 0 | 0 | 0 | 1 |
| 0 | x | x | x | 0 | 1 | 1 | x | S5 | S2 | 0 | 0 | 0 | 0 | 0 | 0 | 0 | 0 | 0 | 1 | 0 | 0 | 0 | 0 | 0 | 1 |
| 0 | x | x | x | 1 | 1 | x | x | S5 | S2 | 0 | 0 | 0 | 0 | 0 | 0 | 0 | 0 | 0 | 1 | 0 | 0 | 0 | 0 | 0 | 1 |
| 0 | x | x | x | 1 | 0 | 0 | x | S5 | S6 | 1 | 0 | 0 | 0 | 0 | 0 | 0 | 0 | 0 | 1 | 0 | 0 | 0 | 0 | 0 | 1 |
| 0 | x | x | x | x | 1 | x | x | S5 | S3 | 0 | 0 | 0 | 0 | 0 | 0 | 0 | 0 | 0 | 1 | 0 | 0 | 0 | 0 | 0 | 1 |
| 0 | 1 | x | x | x | x | x | x | S6 | S6 | 0 | 0 | 0 | 0 | 0 | 0 | 0 | 0 | 0 | 0 | 0 | 0 | 0 | 0 | 0 | 0 |
| 0 | 0 | x | x | x | x | x | x | S6 | S0 | 0 | 0 | 0 | 0 | 0 | 0 | 0 | 0 | 0 | 0 | 0 | 0 | 0 | 0 | 0 | 0 |

```
Procedure Compute(a,b,c,d)
{
    Var e,f,g;

e=a+b;
    if(c<d)
        f=e+11;
    else
        f=e+8;

if(c=0)
        g=f*b;
    else
        g=f+b;

return g;
}
```

| INPUT | PS | NS | OUTPUTS | | | | | | |
|---|---|---|---|---|---|---|---|---|---|
| Reset | | | l1 | l2 | l3 | l4 | l5 | m1 | m2 |
| 1 | Any | S0 | 1 | 1 | 1 | 1 | 0 | 1 | 0 |
| 0 | S0 | S1 | 1 | 0 | 0 | 0 | 0 | 0 | 1 |
| 0 | S1 | S2 | 1 | 0 | 0 | 0 | 0 | 0 | 0 |
| 0 | S2 | S0 | 0 | 0 | 0 | 0 | 1 | 0 | 1 |

FIG. 15

| INPUT | | | PS | NS | OUTPUTS | | | | | | | | |
|---|---|---|---|---|---|---|---|---|---|---|---|---|---|
| Reset | c0 | c1 | | | l1 | l2 | l3 | l4 | l5 | m1 | m2 | m3 | m4 |
| 1 | 0 | 0 | Any | S0 | 1 | 1 | 1 | 1 | 0 | 1 | 0 | 0 | 0 |
| 1 | 0 | 1 | Any | S0 | 1 | 1 | 1 | 1 | 0 | 1 | 0 | 0 | 1 |
| 1 | 1 | 0 | Any | S0 | 1 | 1 | 1 | 1 | 0 | 1 | 0 | 1 | 0 |
| 1 | 1 | 1 | Any | S0 | 1 | 1 | 1 | 1 | 0 | 1 | 0 | 1 | 1 |
| 0 | 0 | 0 | S0 | S1 | 1 | 0 | 0 | 0 | 0 | 0 | 1 | 0 | 0 |
| 0 | 0 | 1 | S0 | S1 | 1 | 0 | 0 | 0 | 0 | 0 | 1 | 0 | 1 |
| 0 | 1 | 0 | S0 | S1 | 1 | 0 | 0 | 0 | 0 | 0 | 1 | 1 | 0 |
| 0 | 1 | 1 | S0 | S1 | 1 | 0 | 0 | 0 | 0 | 0 | 1 | 1 | 1 |
| 0 | 0 | 0 | S1 | S2 | 1 | 0 | 0 | 0 | 0 | 0 | 0 | 0 | 0 |
| 0 | 0 | 1 | S1 | S2 | 1 | 0 | 0 | 0 | 0 | 0 | 0 | 0 | 1 |
| 0 | 1 | 0 | S1 | S2 | 1 | 0 | 0 | 0 | 0 | 0 | 0 | 1 | 0 |
| 0 | 1 | 1 | S1 | S2 | 1 | 0 | 0 | 0 | 0 | 0 | 0 | 1 | 1 |
| 0 | 0 | 0 | S2 | S0 | 0 | 0 | 0 | 0 | 1 | 0 | 1 | 0 | 0 |
| 0 | 0 | 1 | S2 | S0 | 0 | 0 | 0 | 0 | 1 | 0 | 1 | 0 | 1 |
| 0 | 1 | 0 | S2 | S0 | 0 | 0 | 0 | 0 | 1 | 0 | 1 | 1 | 0 |
| 0 | 1 | 1 | S2 | S0 | 0 | 0 | 0 | 0 | 1 | 0 | 1 | 1 | 1 |

FIG. 16

| INPUT | | | PS | NS | OUTPUTS | | | | | | | | |
|---|---|---|---|---|---|---|---|---|---|---|---|---|---|
| Reset | c0 | c1 | | | l1 | l2 | l3 | l4 | l5 | m1 | m2 | m3 | m4 |
| 1 | x | x | Any | S0 | 1 | 1 | 1 | 1 | 0 | 1 | 0 | 0 | 0 |
| 0 | x | x | S0 | S1 | 1 | 0 | 0 | 0 | 0 | 0 | 1 | 0 | 0 |
| 0 | 0 | x | S1 | S2 | 1 | 0 | 0 | 0 | 0 | 0 | 0 | 0 | x |
| 0 | 1 | x | S1 | S2 | 1 | 0 | 0 | 0 | 0 | 0 | 0 | 1 | x |
| 0 | x | 0 | S2 | S0 | 0 | 0 | 0 | 0 | 1 | 0 | 1 | x | 0 |
| 0 | x | 1 | S2 | S0 | 0 | 0 | 0 | 0 | 1 | 0 | 1 | x | 1 |

Tseng

Paulin

GCD

Barcode

Amvabs

Amvdual

Chainedckt

Multibit

METHOD FOR IMPLEMENTING A BIST SCHEME INTO INTEGRATED CIRCUITS FOR TESTING RTL CONTROLLER-DATA PATHS IN THE INTEGRATED CIRCUITS

BACKGROUND OF THE INVENTION

1. Field of the Invention

The present invention relates to the testing of integrated circuits (ICs) and more particularly, to the testing of register-transfer level (RTL) controller-data paths in ICs incorporating built-in self test (BIST) functionality.

2. Description of the Related Art

Integrated circuits (IC) are normally tested both to ensure that the component is defect-free manufactured and/or remains in proper working condition during use. Testing of the IC may for example be accomplished by applying a test pattern to stimulate the inputs of a circuit and monitoring the output response to detect the occurrence of faults. The test patterns may be applied to the circuit using an external testing device. Alternatively, the pattern generator may be a BIST structure comprising part of the internal circuitry of the IC which generates the test patterns.

Although it is desirable when testing the circuit to use exhaustive testing by checking the circuit output response for all possible input permutations, this approach becomes impractical as the number of input variables increases. Thus, a related technique referred to as pseudo-random testing is employed when the number of input variables is so large that it would be burdensome to use an exhaustive testing approach. Because of the relatively low hardware overhead and the simplicity of test pattern generation, pseudo-random testing is the preferred technique for BIST.

With the increasing complexity of integrated circuits, BIST is emerging as a popular testing technique for large and complex designs. BIST has several advantages over other test approaches. For example, since the circuit is tested with pseudo-random test vectors, test generation is no longer needed. Test generation time remains a major bottleneck for gate-level sequential automatic test pattern generation. Also, since the test hardware is integrated into the system in BIST, the circuit can be tested at the operational speed of the circuit, which is not possible in circuits employing either full or partial boundary scan. At-speed testing is important in light of recent work which shows that applying test vectors at the operational speed of the circuit detects more defective integrated circuits than the same test set applied at a slower rate in scan mode. Finally, BIST also has the advantage of allowing field testing of a circuit.

Traditional BIST schemes, however, do suffer from some serious drawbacks. Practical circuits often contain random-pattern resistant faults which result in unacceptable low fault coverage. Thus, the utilization of pseudo-random vectors may not be very good due to the presence of random-pattern resistant faults. In addition, the test (area and delay) overheads tend to be higher than with many other designs for testability schemes. These BIST techniques at the logic level have targeted better test pattern generators, and a reduction in test overheads.

The BIST problem may also be targeted at the register-transfer level (RTL). In view of the drastic reduction in the number of circuit elements needed to perform testing at the RTL, the problem becomes more plausible. At the RTL, there have been some efforts to reduce test overheads by using a testability analysis scheme based on randomness and transparency of modules as described by S. S. K Chiu and C. Papachristou, "A built-in-Self-Testing Approach for Minimizing Hardware Overhead," Proc. International Conference on Computer Design, pp. 282–285, October 1991, which is incorporated herein by reference. A BIST scheme for testing data paths of data-flow intensive RTL circuits was presented in C. Papachristou and J. Carletta, "Test Synthesis in the Behavioral Domain", Proc. International test Conference, pp. 693–702, October 1995, which assumed that both behavioral and RTL information of the circuits are available; in practice, however, this may not be the case.

Other schemes for testing the BIST controller have been presented, as for example by M. Mourani, J. Carletta, and C. Papachristou, "A Scheme for Integrated Controller-Data Path Fault Testing," Proc. Design Automation Conference, pp. 546–551, June 1997. However, in this work the class of circuits is restricted by the requirement that, at most, one multiplexer/bus exists along any register-to-register transfer path. Moreover, the scheme only dealt with register loads and multiplexer select lines coming out of the controller, and did not consider many other types of control lines like ALU select lines, etc. In addition, the complexity of the testability analysis in these schemes is adversely affected by an increase in the bit-width of the data path, thereby limiting their application to small bit-widths. In fact, all experimental results in the above-cited articles are limited to four-bit wide data paths.

Another BIST scheme targeting data paths of data-flow intensive RTL circuits is disclosed in N. Mukherjee, M. Kassab, J. Rajski, and J. Tyszer, "Arithmetic Built-In Self Test for High-Level Synthesis", Proc. VLSI Test Symposium, pp. 132–139, May 1995. This scheme reduced the complexity of testability analysis by concentrating on subspace state coverage. It also reported low area and delay overheads. However, since it relies on arithmetic units for test generation and compaction, its applicability to control-flow intensive circuits is limited. In addition, it does not consider the testability of the combined controller-data path.

SUMMARY OF THE INVENTION

The present invention provides a method for testing RTL controller-data paths in integrated circuits using a BIST scheme without imposing any major design restrictions on the circuit. The only assumption made is that a reset state is present in the controller.

In accordance with the inventive method, a state table is extracted from the controller netlist of the circuit using a state machine extraction program. The untested RTL elements/modules of the RTL circuit within the integrated circuit are then selected, and the test control and data flow (TCDF) of the circuit are extracted from the controller/data path. Once the TCDF is extracted for the selected RTL elements of the RTL circuit, a symbolic testability analysis (STA) is performed to obtain test environments for as many untested data path elements as possible. This procedure may add additional test multiplexers to the data path to increase the controllability and observability of the circuit at certain points at which there are testability bottlenecks. The controller input sequence at the select signals of these test multiplexers needed for the particular test environment is noted and/or stored. If possible, these sequences are merged with existing sequences generated for testing other data path elements. This process is then repeated until all RTL elements have been tested.

Once all elements are tested, a BIST controller is synthesized from the stored input sequences. This synthesis includes an analysis of the test environments to detect the occurrence of circular paths. The input and output registers, for which circular paths are not a problem, are converted to pseudo-random pattern generators (PRPGs) and multiple input signature registers (MISRs), respectively. Extra PRPGs and MISRs are instead added along with test multiplexers at the primary input ports and primary output ports of the circuit only. Finally, the circuit is integrated with the BIST components using the determined BIST architecture.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote similar elements through the several views:

FIG. 8 is a controller state table derived from the circuit of FIG. 7;

FIG. 15 is a state table for the circuit of FIG. 14;

FIG. 16 is a modified state table for the circuit of FIG. 14 after pruning unused I/O combinations in accordance with the present invention;

DETAILED DESCRIPTION OF THE PRESENTLY PREFERRED EMBODIMENTS

Figure 1:
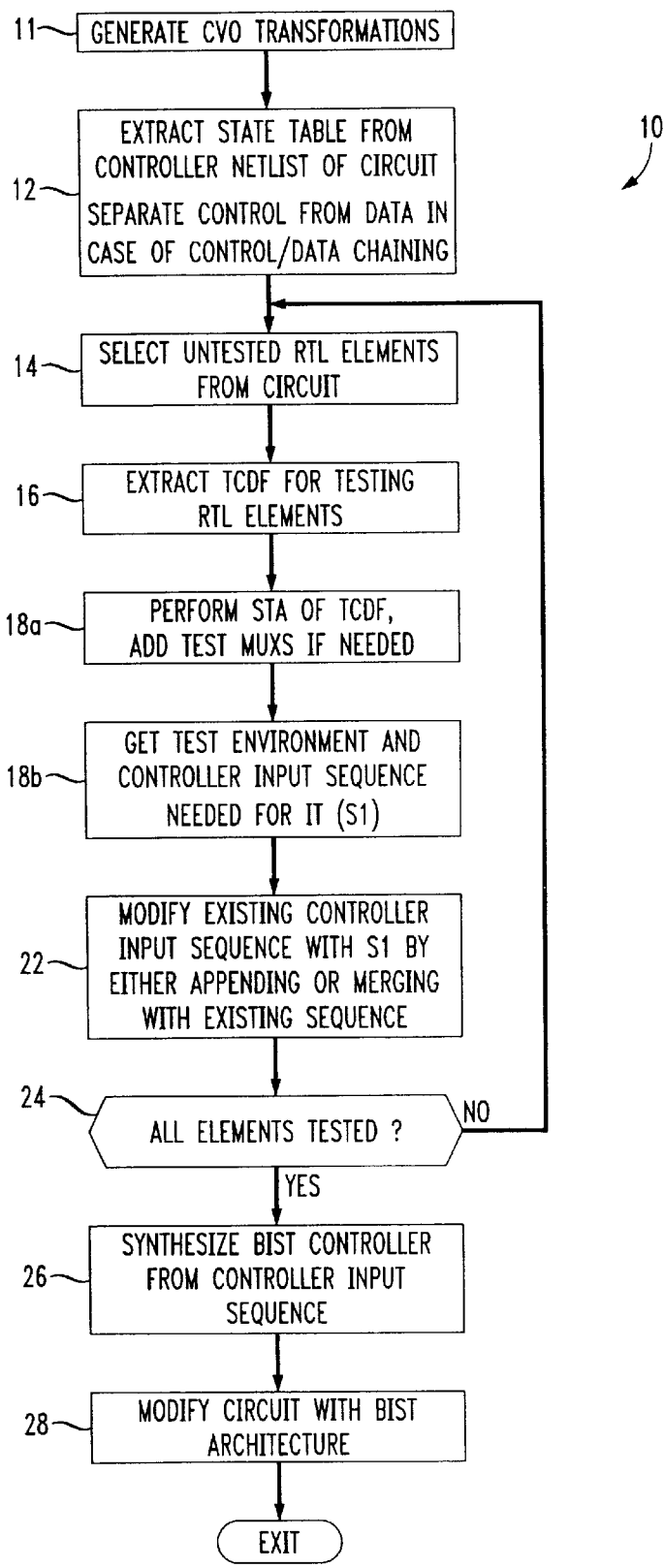
FIG. 1 is a block diagram of a method for testing RTL controller/data paths using BIST according to an embodiment of the invention.

FIG. 1 is a flow diagram showing a general overview of a method 10 for testing RTL controller-data paths using BIST in accordance with an embodiment of the present invention. The following description of each step of the method 10 generally follows the flow of the overview provided in FIG. 1. The following terms are defined for clarity in understanding the following disclosure. An RTL circuit is generally the entire (or complete) circuit design in the register transfer level (RTL). An RTL module is a subcircuit of an RTL circuit and the RTL element is the lowest level of RTL component, for example, an adder, multiplier, etc.

Upon initiation of the method, the RTL modules in the library are examined and controllability, verifiability, and observability (CVO) transformation tables are generated for each of the RTL modules making up the RTL circuit in accordance with their respective functionality (step 11). These CVO transformations are used later in the invention method for symbolic justification and propagation in the testability analysis phase. The CVO transformations take care of the bit-widths at the inputs and outputs of each module. It is important to note, however, that generation of the CVO table is a one-time requirement and that these transformation rules can thereafter be repeatedly re-used for each RTL circuit designed with the library. A state table is then extracted from a controller netlist of the circuit (step 12). The state table can be generated using any one of many different and readily available and known state machine extraction programs starting from the reset state of the controller. For exemplary purposes, the herein described embodiment of the invention uses a state machine extraction program called "SIS" disclosed by E. Sentovich, K. Singh, C. Moon, H. Savoj, R. Brayton, and A. Sangiovanni-Vincentelli in "Sequential circuit design using synthesis and optimization", *Proc. International Conference on Computer Design.* pp. 328–333, October 1992, which is incorporated herein by reference.

As stated in this article, SIS is an interactive tool for synthesis and optimization of sequential circuits. Given a state transition table or a logic-level description of a sequential circuit, it produces an optimized net-list in the target technology while preserving the sequential input-output behavior. A state transition table for a finite-state machine can be specified with the Kiss format, used extensively in state assignment and state minimization programs. Each state is symbolic; the transition table indicates the next symbolic state and output bit-vector given a current state and input bit-vector. External don't care conditions are indicated by a missing transition (i.e., a present-state/input combination that has no specified next-state/output) or by a '—' in an output bit (indicating that for that present-state/input combination that particular output can be either 0 or 1.)

If there are data path outputs directly feeding data path control signals (control/data chaining), the controller state table is modified with these input/output signals, as explained hereinbelow in further detail. The modified controller state table increases in size exponentially with the number of chained signals; hence, a "don't care" analysis is preferred to prune the controller state table.

Once the state table has been generated, the untested RTL elements of the RTL circuit are selected (step 14). After selection, the test control/data flow (TCDF) for testing the selected RTL elements is extracted from the controller netlist and the data path of the circuit (step 16) using a technique described by I. Ghosh, A. Raghunathan, and N. K. Jha in "A design for testability technique for RTL circuits using control/data flow extraction", *Proc. International Conference of Computer-Aided Design*, pp. 329–336, November 1996, which is incorporated herein by reference (hereinafter referred to as "Ref 1").

This article discloses a new methodology for making RTL circuits hierarchically testable using very little test hardware and without assuming they are obtained through behavioral synthesis. The only restriction imposed on the circuits is that they should have a separate data path and controller, and the controller should have a reset state. This scheme works by extracting a test control-data flow (TCDF) from the data path/controller circuitry and uses it to justify precomputed module test sets from the system inputs to module inputs and propagate error responses from module outputs to system outputs. When this is not possible, test multiplexers are added to the data path to increase its controllability and observability. A key feature of this technique is that it analyzes the data path and controller of an RTL circuit and extracts test data and control flow graph. This graph is then used to test the circuit hierarchically by justifying and propagating precomputed test sets of modules in the circuit from system inputs and propagating the output responses to system outputs. If it is not possible to do so, then test multiplexers are added at suitable places to increase the hierarchical controllability and observability of the circuit during the test mode. To ease the task of TCDF generation, this article defines several techniques to be applied to the controller state machine and data path and defines a test architecture which is necessary for the process. The advantages of the technique are: (i) low area, delay and power overheads, (ii) high fault coverage, (iii) several orders of magnitude of reduction in test generation time over gate-level ATPG, and (iv) at-speed testability.

The TCDF consists of operations mapped to modules in the circuit and variables mapped to registers. Once the TCDF has been extracted, a symbolic testability analysis (STA) is performed (step 18a) and used to derive a set of symbolic justification and propagation paths (known as test environments) to test some of the operations and variables present therein. The STA is performed as described by S. Bhatia and N. K. Jha in "Genesis: A Behavioral Synthesis System for Hierarchical Testability," in *Proc. European Design & Test Conference*, pp. 272–276, February 1994 (hereinafter referred to as "Ref 2") and I. Ghosh, A. Raghunathan, and N. K. Jha in "Design for Hierarchical Testability of RTL Circuits Obtained by Behavioral Synthesis", *Proc. International Conference on Computer Design*, pp. 173–179, October 1995 (hereinafter referred to as "Ref 3"), both of which are incorporated herein by reference. This procedure may add additional test multiplexers to the data path to increase the controllability and observability of the circuit at certain points where there are testability bottlenecks.

Ref. 2 discloses a novel behavioral synthesis technique that guarantees high, usually 100%, and easy testability of data paths even in the presence of loop constructs in the behavioral description. Given a test set for each module, the aim of the behavioral synthesis system called Genesis, is to make it possible to obtain a system-level test set with 100% test coverage of each embedded module. A 100% system-level test coverage obviously implies a 100% system-level faulty coverage of all detectable faults. This article utilizes the transformation functions of various modules imbedded in the data path to identify the justification and propagation paths for testing of an operation and the module it gets mapped to. A test environment starts at the system (primary) inputs and ends at the system (primary) outputs. It can justify any desired value at the inputs of the operation node from the primary inputs, and observe its output at the primary outputs. A test environment of an operation is independent of the operation/module test set. The test environment for an operation is also a test environment for the module that the operation gets mapped to after allocation. The advantage of targeting operations in a DFG, rather than a module, is that the original control/data flow as given by the DFG for test justification and propagation is followed.

Ref. 3 describes an efficient non-scan technique for achieving the testability benefits akin to the Genesis system for RTL controller/data path circuits synthesis by a behavioral synthesis system even if it does not target testability during synthesis. The DFT algorithm here disclosed uses hierarchical testability analysis to identify signals in the given RTL circuit which are bottlenecks from the hierarchical controllability and/or observability point of view. It then selectively inserts test multiplexes at few locations to render the circuit hierarchically testable. Generally, the addition of one test multiplexer is sufficient to solve the testability problems of several modules. Moreover, there are typically several locations where test multiplexers can be added to produce the same testability effect. Hence, area overheads are nominal and critical paths can usually be avoided even for extreme cases. Test generation is performed by following the control/data flow imposed by the controller, hence any overheads in order to provide controllability of the control signals through scan or otherwise in not required. It is assumed that the controller has a reset, however, the data path registers are not assumed to have any reset capability. The method disclosed can handle loops and conditionals and constructs such as multicycling, chaining and structural pipelining.

The STA of the TCDF generates a test environment and the controller input sequence of the selected signals needed for the particular test environment is noted, or stored for future reference (step 18b). When additional multiplexers are added to increase controllability and observability, they too are included in the test environment, and the corresponding controller input sequence of the selected signals of the test multiplexers needed for the test environment are noted or stored for future reference. The newly generated controller input sequence corresponding to the test environment is then modified by either appending or merging it with an existing sequence (step 22).

At this point, a determination is made as to whether all of the test elements have been tested (step 24). If not, then the process returns to step 14 to select untested RTL elements from the circuit. When all elements are determined to have been tested at step 24, the BIST controller is synthesized from the modified controller input sequence (step 26). With the BIST controller synthesized, the circuit is modified with the BIST architecture (step 28) and the process ends.

It is important to note that the methods presented in Refs 1–3 are targeted toward deterministic test generation, and not BIST. Since the search for a test environment is done symbolically, it is very fast and need be done only once for each module or register in the circuit. As herein disclosed, the test environment is then used to exercise a module or register in the circuit with the PRPGs placed only at the primary inputs of the circuit. The test responses can be analyzed with the multiple input signature registers MISRs, which are only placed at the primary outputs of the circuit. The test environments are also analyzed to see if primary input registers can themselves be converted to PRPGs and primary output registers converted to MISRs to further reduce testing overhead.

Making RTL Modules Random-Pattern Testable

If elements present in the RTL design library are not individually random-pattern testable, they can obviously degrade the fault coverage of an RTL circuit when they are embedded in the circuit. In practice, most RTL elements are random-pattern testable. For example, adders, subtractors, shifters, multiplexers, registers, and buses are all random-pattern testable. Even 32-bit versions of these elements can be fully tested with less than 50 pseudorandom vectors. Multipliers are slightly random-pattern resistant; however, a 32-bit multiplier can be fully tested with approximately 500 pseudorandom vectors. Since a 16-bit linear feedback shift register (LFSR) is capable of generating about 65,000 vectors, a multiplier does not create a significant testability bottleneck. The real bottleneck lies with comparators, which are highly random-pattern resistant. Hence, in order to boost the random-pattern testability of these modules, some logic-level techniques are employed. Random-pattern testability of a logic level module can be enhanced with the help of a few test points, i.e. extra control/observation points. Initially, the probability of a logic 1 (1-probability)occurring at the input lines of the module is assumed to be 0.5. Then, the 1-probability at all of the internal lines of the module are calculated by transforming probability values through logic gates. Whenever the 1-probability is higher than 0.75 or lower than 0.25 on a line, it is lowered or increased with the help of an extra control point such as an AND gate with a test input or an OR gate with a test input. Similarly, the probability of observing the value on a line at a module output can be calculated by propagating probability values backward from the outputs of the module and increasing the observability of poorly observable lines with an extra observation point. These observation points can then be compacted with an XOR tree to create a single observation point.

Figure 2:
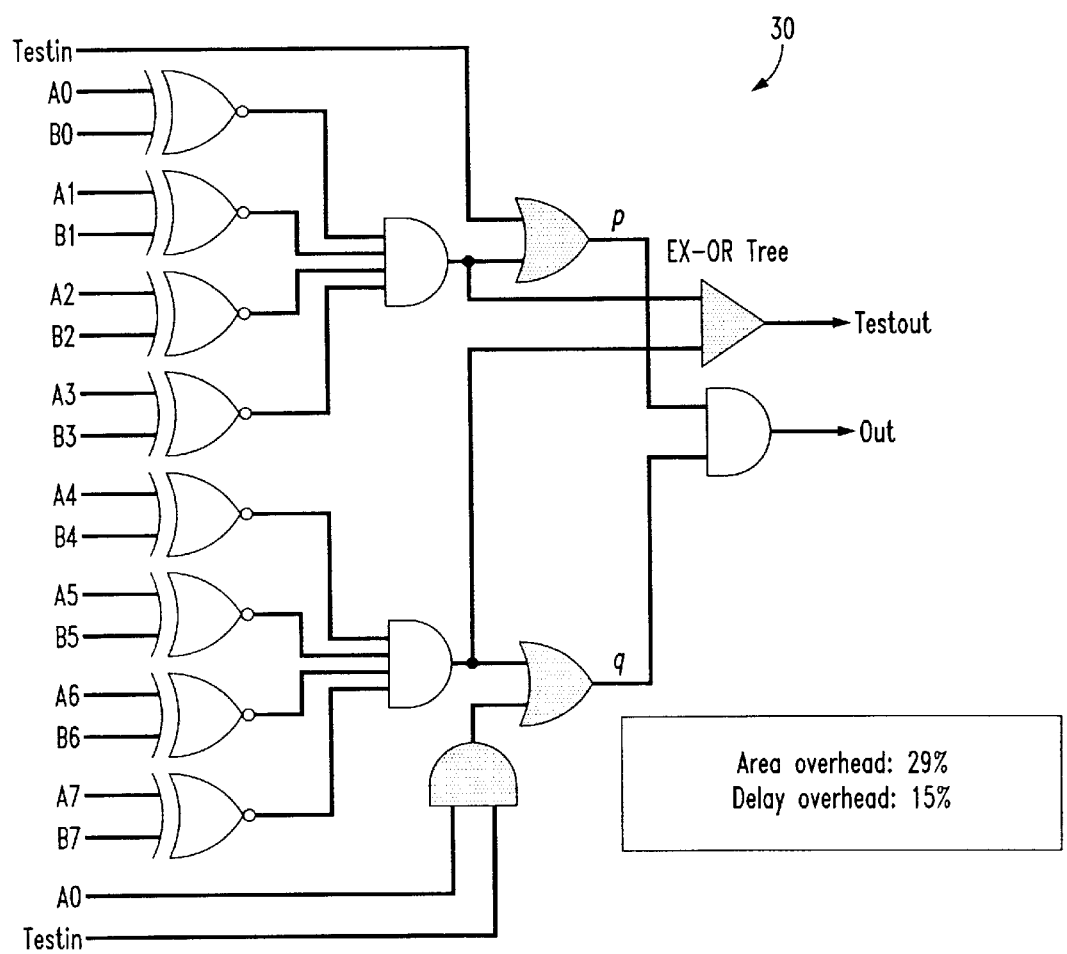
FIG. 2 is a schematic diagram of a gate level analysis performed according to an embodiment of the invention.

FIG. 2 shows a random-pattern testable 8-bit equal-to comparator 30 with extra test hardware shown in shaded form. The comparator uses one extra input Testin and one extra output Testout. In general, an n-bit comparator can be made random-pattern testable with n/8 extra inputs and one extra output; this design is thus scalable. The extra input and output lines are connected to PRPGs and MISRs, respectively, and therefore do not require any extra pins when the comparator is a part of an RTL circuit. To obtain this design, a probabilistic analysis has been used to increase the probability of occurrence of a logic 1 at points p and q. Similarly, the observability of a poorly observable point is boosted with the help of an XOR tree, which exhibits the property that if any odd number of its inputs has an error, the error is guaranteed to propagate to the tree's output. Hence, XOR trees are widely used to make errors on internal lines of the circuit observable at the tree's output. This is a well-known method in the industry.

The area and delay overheads are also shown in FIG. 2. Although the overheads may seem large, the overheads of the BISTed RTL circuit in which these comparators are embedded remain small, as is evident in the experimental results discussed hereinbelow. The area and delay overheads are obtained after technology mapping the gate-level circuit using the stdcellL2.genlib cell library in the SIS logic synthesis system.

Figure 3:
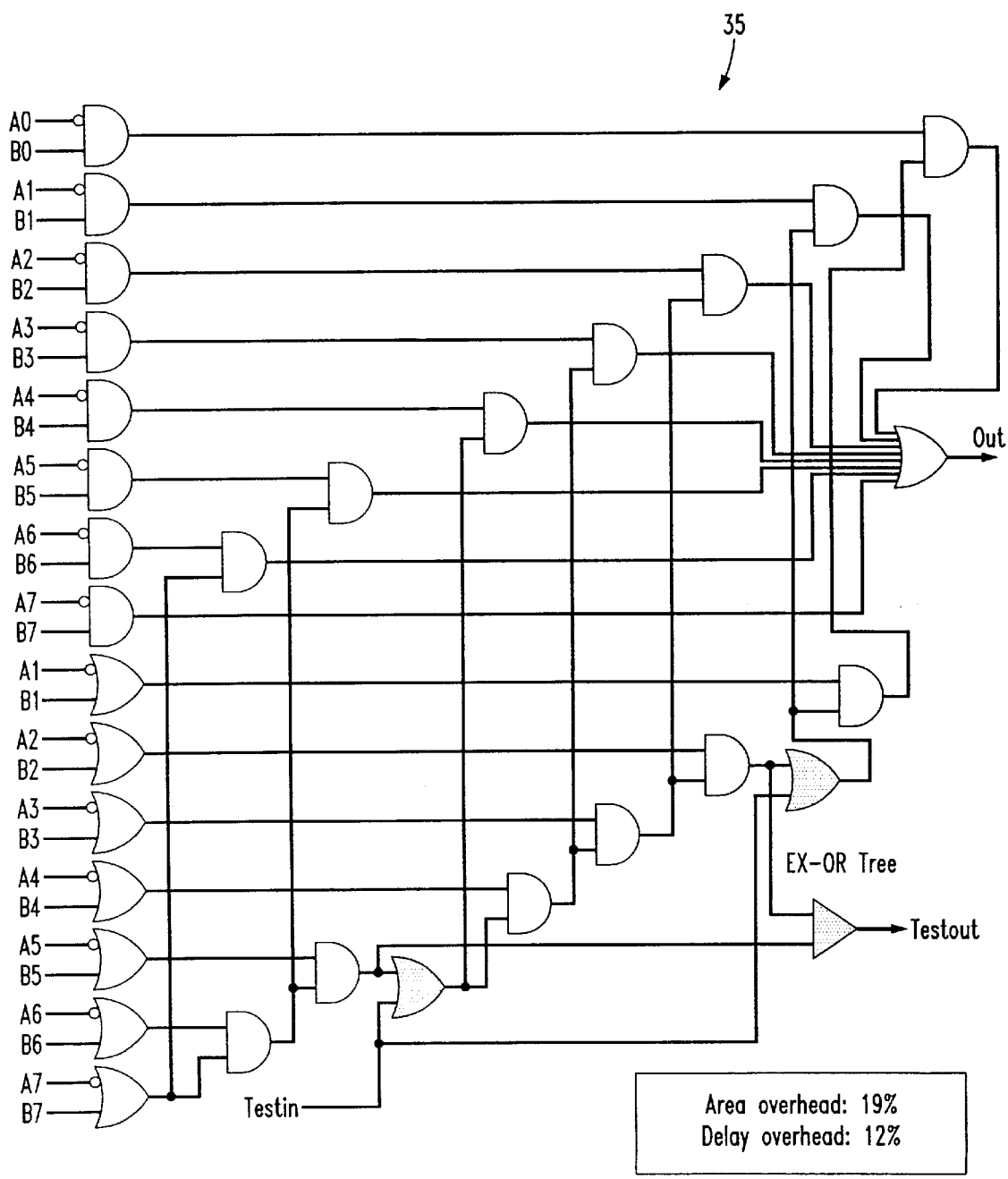
FIG. 3 is a schematic diagram of another gate level analysis performed according to an embodiment of the invention.

FIG. 3 shows a less-than comparator 35 modified for random-pattern testability. In this case, better testability has been achieved by boosting the 1-controllability and observability of the large AND chain at regular intervals. "1-controllability" of a signal (or node) is the ability to set a logic value of 1 on the signal. An n-bit less-than comparator can be made random-pattern testable with only one extra input and one extra output. Note that any other type of comparator can be obtained from the above two comparators. Table 1 summarizes the characteristics of the original and modified comparators, and shows that in order to obtain good fault coverage for the higher bit-widths and reduce the number of test cycles for lower bit-widths, it becomes necessary to incur the test overheads.

TABLE 1

Testability of comparators before and after modification

| | | Original | | Modified | | | |
|---|---|---|---|---|---|---|---|
| Circuit | Bit-width | Fault Cov. | Test Cycles | Fault Cov. | Test Cycles | Area Ovhd. | Delay Ovhd. |
| Equal-to | 4 | 100% | 50 | 100% | 50 | 0% | 0% |
| Comparator | 8 | 100% | 3500 | 100% | 500 | 29% | 15% |
| | 16 | 44.8% | 20000 | 100% | 1200 | 28% | 15% |
| | 32 | 0.4% | 40000 | 100% | 7000 | 28% | 15% |
| Less-than | 4 | 100% | 30 | 100% | 15 | 10% | 12% |
| Comparator | 8 | 100% | 6500 | 100% | 250 | 19% | 12% |
| | 16 | 88.8% | 20000 | 100% | 600 | 18% | 13% |
| | 32 | 56.3% | 40000 | 100% | 6500 | 18% | 13% |

Extracting Control/Data Flow Information (Step 16 of FIG. 1)

Figure 4:
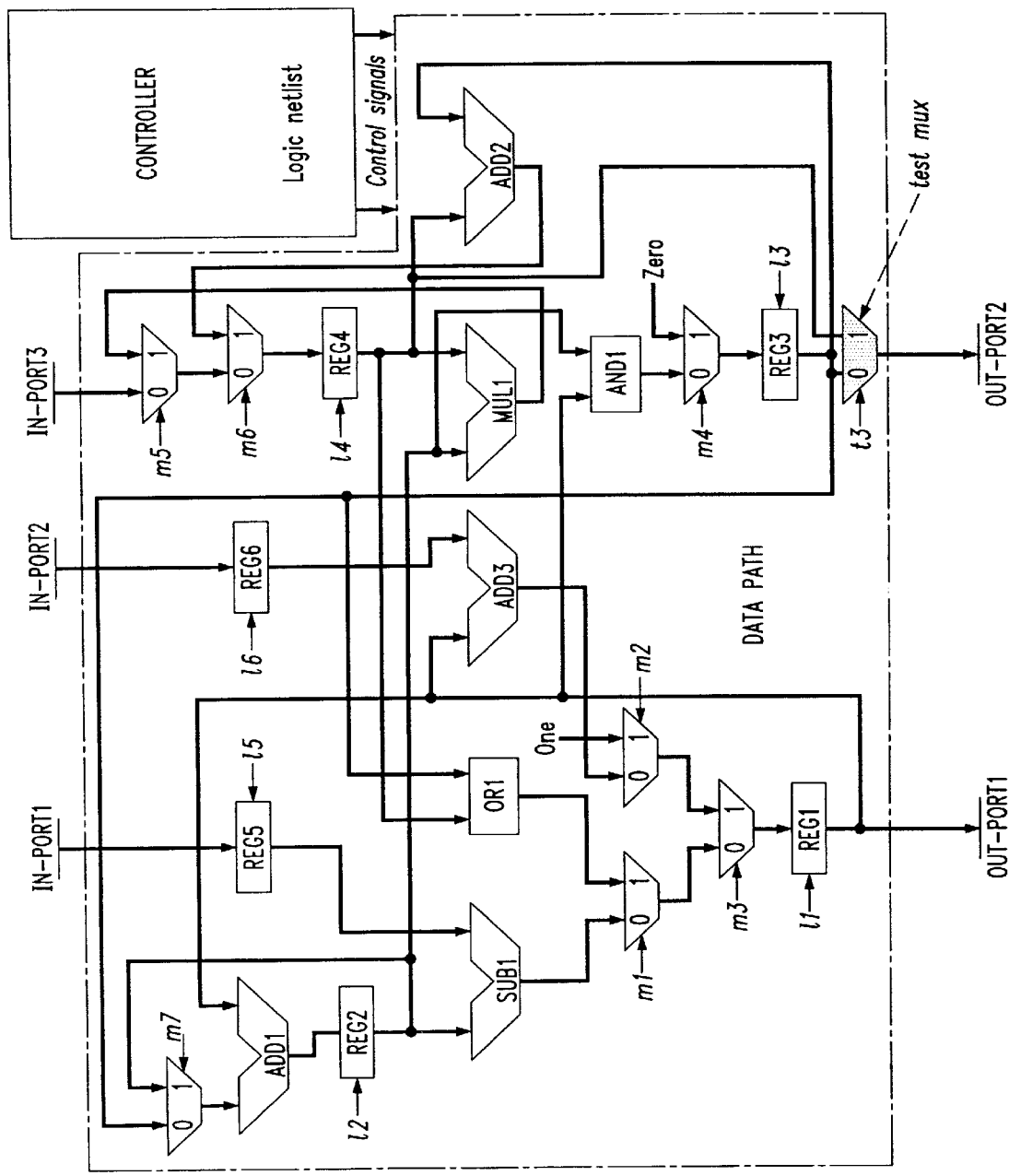
FIG. 4 is a schematic diagram of a popular benchmark RTL circuit used to further describe the disclosed method for testing RTL controller/data paths using BIST according to the invention.

FIG. 4 shows the RTL circuit 40 of a popular benchmark circuit (Tseng). This particular RTL implementation was synthesized by the Genesis high-level synthesis system. (See S. Bhatia and N. K. Jha, "Genesis: A Behavioral Synthesis System for Hierarchical Testability", *Proc. European Design & Test Conf.*, pp. 272–276, February 1994, and S. Bhatia and N. K. Jha, "Behavioral Synthesis for Hierarchical Testability of Controller/Data Path Circuits with Conditional Branches", *Proc. Int. Conf. Computer Design*, pp. 91–96, October 1994, both of which are incorporated herein by reference). The inputs are applied at IN-PORT1, IN-PORT2, and IN-PORT3 and the outputs are observed at OUT-PORT1 and OUT-PORT2. The data path consists of three adders (ADD1, ADD2, ADD3), a multiplier (MUL1), a subtractor (SUB1) an AND array (AND1), an OR array (OR1), six registers (REG1–REG6) and some multiplexer trees (m1–m7). The shaded test multiplexer t1 is not a part of the original circuit.

The first step in the BIST process is to extract the TCDF using the RTL data path and controller netlist. First, the controller state table is extracted from the controller netlist. As described earlier, this can be done by a state machine extraction program, such as SIS. The process starts from the controller reset state and extracts the input/output and state transition information of all reachable states. The extracted controller state table for the circuit of FIG. 4 is shown in Table 2.

TABLE 2

The controller state table for the circuit of FIG. 4

| INPUT | STATE | | OUTPUTS | | | | | | | | | | | | |
|---|---|---|---|---|---|---|---|---|---|---|---|---|---|---|---|
| reset | PS | NS | l1 | l2 | l3 | l4 | l5 | l6 | m1 | m2 | m3 | m4 | m5 | m6 | m7 |
| 1 | any | S0 | 1 | 0 | 1 | 1 | 1 | 1 | 0 | 1 | 1 | 1 | 0 | 0 | 0 |
| 0 | S0 | S1 | 0 | 1 | 0 | 0 | 0 | 0 | 0 | 0 | 0 | 0 | 0 | 0 | 0 |
| 0 | S1 | S2 | 1 | 0 | 0 | 1 | 0 | 0 | 0 | 0 | 0 | 0 | 1 | 0 | 0 |
| 0 | S2 | S3 | 1 | 1 | 0 | 1 | 0 | 0 | 0 | 0 | 1 | 0 | 0 | 1 | 1 |
| 0 | S3 | S4 | 1 | 0 | 1 | 0 | 0 | 0 | 1 | 0 | 0 | 0 | 0 | 0 | 0 |
| 0 | S4 | S0 | 0 | 0 | 0 | 1 | 1 | 1 | 0 | 0 | 0 | 0 | 0 | 0 | 0 |

The basic idea behind extracting the TCDF from the RTL circuit is to extract operations executed in each cycle and keep track of variables present in each register or latch. In accordance with the present invention, all registers that load in the first cycle are identified by analyzing the load signals of all of the registers in the data path from the outputs in the state table. If a load signal is 1 in any cycle, then the register loads in that cycle. In the circuit example of FIG. 4, in cycle 1 all registers except REG2 load. If there are any latches, they load by default in each cycle. The multiplexer tree that feeds each of the registers or latches is then analyzed and a determination is made as to whether any input port is connected to the register/latch input in the first cycle. The multiplexer tree configuration in any cycle is obtained by looking at the values of the select signals of those multiplexers in the state table. As can be seen, IN-PORT1, IN-PORT2 and IN-PORT3 are connected to REG5, REG6, and REG4, respectively, in the first cycle. Hence, three variables are generated in these three registers, and are referred to as i1, i2 and i3, respectively (See FIGS. 5–6). A variable is live until its register loads again. Thus, the variable-to-register binding information is developed in each cycle and the variables allocated to a particular register are noted. On the other hand, it is determined that in the first cycle, REG1 and REG3 are connected to hardwired constants referred to as constants c1 and c2, respectively (See FIGS. 5–6).

Figure 5:
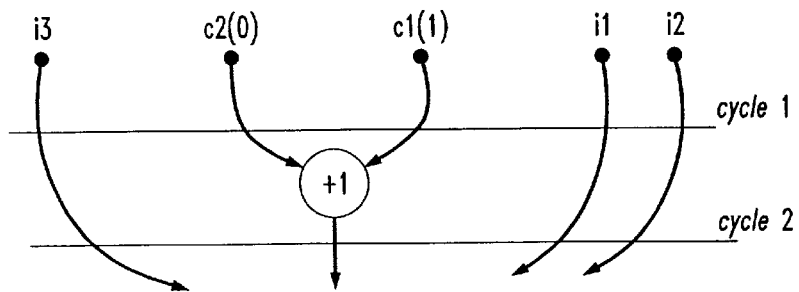
FIG. 5 is a partial representation of the control data flow graph (CDFG) of the extracted TCDF of the circuit of FIG. 4.
Figure 6:
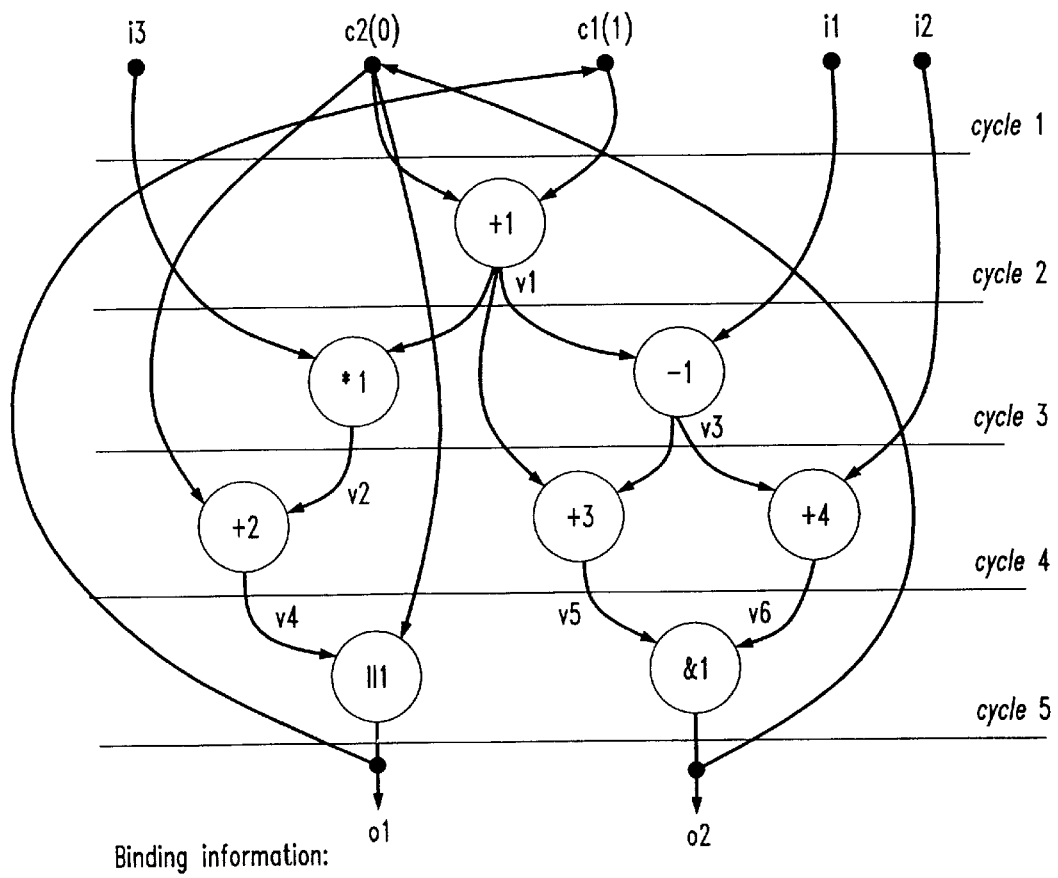
FIG. 6 is a complete diagrammatic representation of the control data flow graph (CDFG) of the extracted TCDF of the circuit of FIG. 4.

Referring now to FIGS. 4–6, in cycle 2 the operations that take place are next identified. Hence, for each module in the circuit, the operand selected at each of its input ports is determined by analyzing the multiplexer trees at its inputs. For example, the left input of the adder, ADD1, is connected to REG3 and the right input to REG1. Both of these registers are checked to determine the possible presence of some live variables therein. In this case, the live variables are c2 and c1, respectively. In addition, a determination is made whether any of the registers (there may be many due to fanout) at the output of the module load at the end of the second cycle, and whether the multiplexer configuration at the input of these registers is such that the output of the module is selected. In the case of adder ADD1, REG2 indeed loads at the end of the second cycle. Hence, a new variable v1 is created in REG2, and a new operation is created in the TCDF (i.e., c1+c2=v1). This operation is labeled as +1. Similarly, all other modules are analyzed in order to obtain the set of operations that execute in the second cycle, as shown in FIG. 5 (in which the values of the constants are also shown in parentheses). Since no other register loads, +1 is the only operation created in this cycle. By repeating this procedure for five cycles, the TCDF shown in FIG. 6 is generated, in which the constants c1 and c2 are the initial values of the loop outputs.

Test Environment Generation (Steps 18a and 18b of FIG. 1)

Once the TCDF for an RTL circuit has been obtained, it is used to generate test environments for all of the RTL elements in the circuit. Before the test environment generation procedure can be explained, a few terms need to be defined. The general controllability $Cg$ of a TCDF variable is the ability to control it to any arbitrary value from the system primary inputs. The observability, $Ov$, of a TCDF variable is the ability to observe it at any arbitrary value at a system primary output. Similarly, $Cq$ is the defined as the controllability to some arbitrary constant q; special cases of $Cq$ includes $C1$=controllability to 1, $C0$=controllability to 0, and $Ca1$=controllability to the all -1's vector. The verifiability $V$ of a TCDF variable is the ability to verify its value by either controlling or observing it. The controllability, observability and verifiability are all Boolean parameters, i.e. they can only take on the values 1 or 0, depending on whether or not, respectively, the variable has the corresponding ability. Another field is also added to these parameters to designate the cycle in which the particular property of the variable is desired. Hence, $Cg(2)$ of a TCDF variable means that the variable must be controlled to an arbitrary value in cycle 2.

Consider now by way of example the addition operation +4. The test environment of this operation will be used to test adder ADD 3 in the RTL circuit of FIG. 4. The test environment is obtained using a series of controllability, verifiability and observability (CVO) transformations as follows: Referring to FIGS. 4 and 6, for operation +4, we need $Cg((\alpha)$ of v3, $Cg(\alpha)$ of i2 and $Ov(\alpha+1)$ of v6. $Ov(\alpha+1)$ of v6 is trivially achieved since v6 is mapped to REG1 which is connected to primary output OUT-PORT1. $Cg(\alpha)$ of i2 is transformed to $Cg(\alpha-2)$ of i2 which is trivially satisfied since i2 is a primary input variable. $Cg(\alpha)$ of v3 is transformed through operation −1 to $Cg((\alpha-1)$ of v1 and $Cq(\alpha-1)$ of i1. $Cg(\alpha-1)$ of v1 is transformed through operation +1 to either $Cg(\alpha-2)$ of c1 and $Cq(\alpha-2)$ of c2, or $Cg(\alpha-2)$ of c2 and $Cq(\alpha-2)$ of c1. Since either objective is unachievable, as both c1 and c2 are constants, we backtrack and transform $Cg(\alpha)$ of v3 to $Cq(\alpha-1)$ of v1 and $Cg(\alpha-1)$ of i1 through operation −1. $Cg(\alpha-1)$ of i1 is transformed to $Cg(\alpha-2)$ of i1, which is trivially satisfied as i1 is a primary input variable. $Cq(\alpha-1)$ of v1 is transformed to $Cq(\alpha-2)$ of c1 and $Cq(\alpha-2)$ of c2. Both of these are now satisfied and, hence, all objectives for testing operation +4 are fulfilled. Next, the test environment is examined and a value of 1 is assigned to the lowest symbolic cycle value, which is $(\alpha-2)$, and all of the cycle values are calculated accordingly. Thus, if we control i1 and i2 in cycle 1 and observe v6 in cycle 4, we have tested +4 with a test vector applied at the primary inputs. From the BIST point of view this means that if we place a pair of pseudorandom vectors at IN-PORT1 (primary input 1) and IN-PORT2 (primary input 2) in cycle 1 derived from PRPGs (FIGS. 4 and 6), and analyze the output at OUT-PORT1 in cycle 4 with an MISR, we have tested adder ADD3 with a pseudorandom test pattern.

Test Multiplexer Insertion (Step 18a of FIG. 1)

Sometimes, however, it may not be possible to obtain a test environment for an RTL element using the existing behavior of the circuit; that is, the STA cannot be completely and accurately performed due to testability bottlenecks. In the example of FIG. 4, the ADD2 element is symbolically untestable since operation +2 (FIG. 6) mapped to ADD2 does not have a test environment by virtue of the reconvergent fanout of constant c2. (Note that c2 is a constant in the first iteration of the control data flow graph (CDFG) only, but can be controlled to an arbitrary value at the beginning of the second iteration). Variable c2 must be non-zero to provide general controllability to the left input of +2, but must also be zero for propagating its output v4 through ||1 (FIG. 6). In such cases, the problem is solved by adding a test multiplexer t1, as shown in FIG. 4. Thus variable v4, which is mapped to REG4, is observable at the primary output OUT-PORT2. The procedure for adding test multiplexers is given in Ref 3, and utilizes a badness count for TCDF variables to identify testability bottlenecks in the TCDF, and thus the RTL circuit to which the TCDF is mapped. Appropriate test multiplexers are then inserted at those points. This procedure attempts to avoid the critical path, whenever possible, while adding the test multiplexers. Since a large number of solutions typically exist for overcoming a testability bottleneck, avoiding of the critical path is usually possible. The select signals of these test multiplexers come from a BIST controller which is described hereinbelow.

Registers may be similarly targeted for test environment generation by generating a test environment for any one variable mapped to a register. Test environments can also be generated for multiplexers; however, test multiplexers are added to overcome test environment bottlenecks for modules only, since they are overkill for other RTL elements. It is thus clear that the test environment of an RTL element guarantees that a test path exists from the primary input(s) to the input(s) of the element and from the output of the element to a primary output. This fact is utilized in the BIST scheme of the present invention.

Modifications for Control-Flow Intensive Circuits (Step 22 of FIG. 1)

Figure 7:
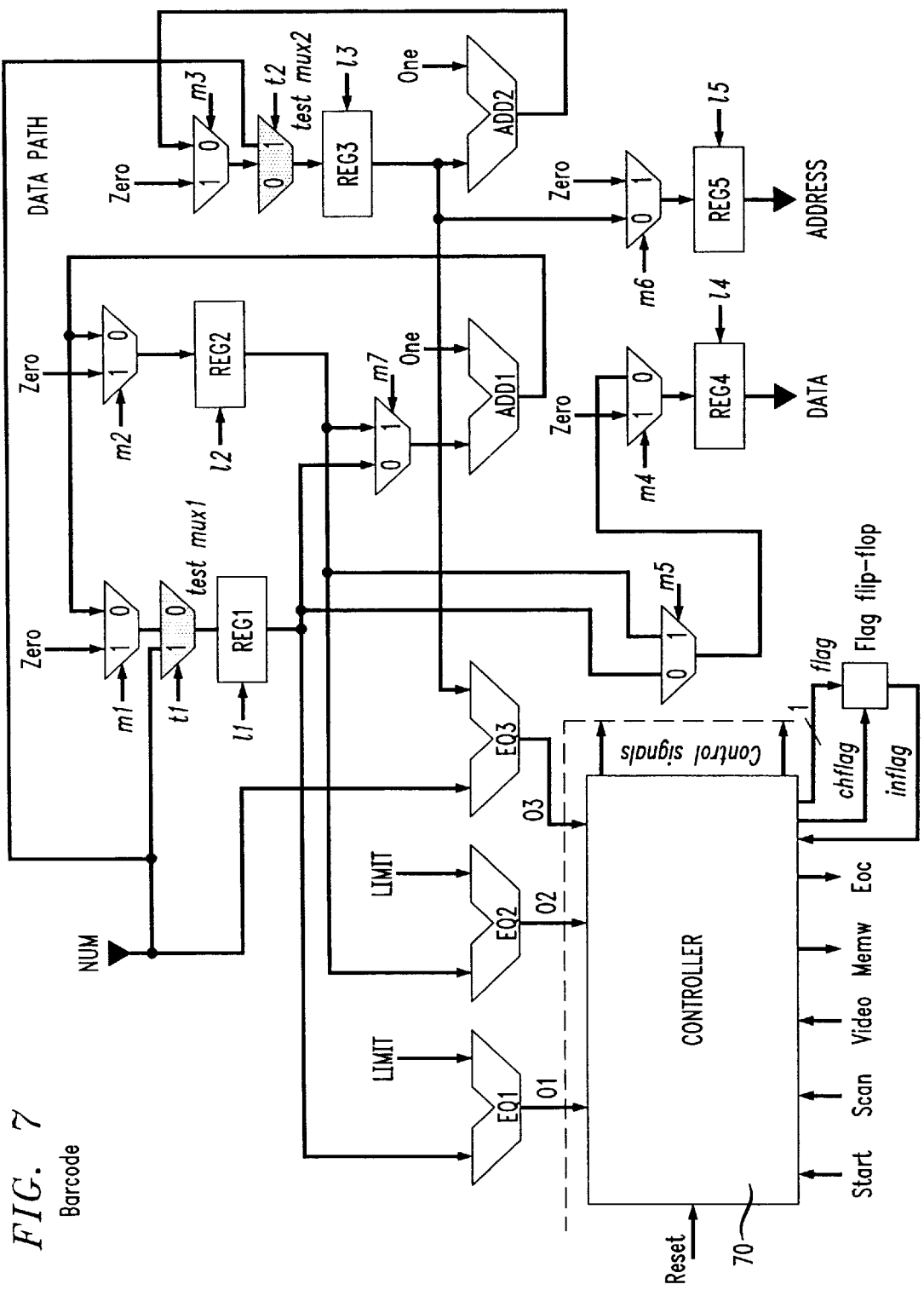
FIG. 7 is a schematic diagram of another exemplary RTL circuit used to further describe the disclosed method for testing RTL controller/data paths using BIST according to the invention.

In the case of control-flow intensive circuits, some modifications need to be made to the method thus far described. These modifications are explained with reference to another popular benchmark circuit called Barcode, shown in FIG. 7. The extracted state table of the controller 70 of the circuit is shown in FIG. 8. The Barcode circuit of FIG. 7 is commonly used as a preprocessor to read barcodes printed on objects. The scan input from a video camera is fed to the signal input video and the width of the scanned white and black bars are output at DATA to be written in consecutive locations in memory pointed to by ADDRESS. The data path consists of two incrementers, ADD1 and ADD2. There are three equal-to comparators EQ1, EQ2, and EQ3 and a few registers and multiplexers. The bit-width of the data path is eight and the constants in the data path are swept during logic synthesis.

Figure 9:
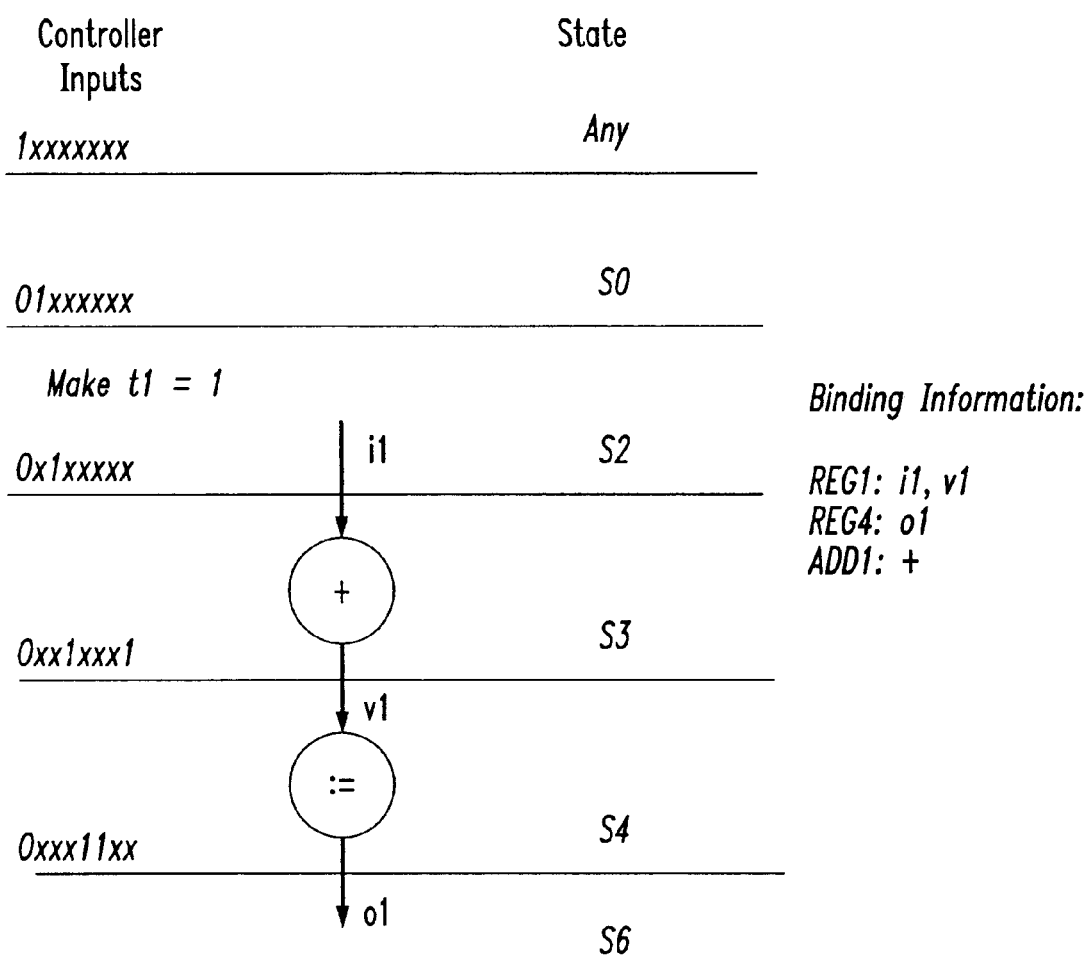
FIG. 9 is a representation of the TCDF generated for one element in the circuit of FIG. 7 according to an embodiment of the present invention.

The main problem in extending the approach thus far described lies in the status signals fed by the data path to the controller. The TCDF for an operation is usually input vector dependent as the data and control flow of the data path changes as a function of the input vectors applied. Hence, in order to generate a fixed TCDF for an operation during the test mode, the status inputs of the controller need to be controlled. The TCDF generated for the incrementer ADD1 is shown in FIG. 9. In FIG. 9, the (:=) operation denotes a register-to-register transfer. Since no direct input is possible from the primary input to the module input, the extraction procedure performs a shortest path analysis on the controller state transition graph, and creates a test path by placing the test multiplexer test mux2 as shown (FIG. 7). This modification is explained in detail in Ref 1. The TCDF is then generated with the controller input signals and the test multiplexer select signals required to generate such a TCDF. During the BIST mode, these signals are fed to the controller from a BIST controller. Thus, a TCDF for ADD1 is guaranteed. Once the TCDF is obtained, test environment generation can proceed as explained hereinabove. A single TCDF is usually not enough to test all of the data path elements in a control-flow intensive RTL circuit, and more than one TCDF is therefore generally required.

Synthesizing a BIST Controller (Step 26 of FIG. 1)

Figure 10:
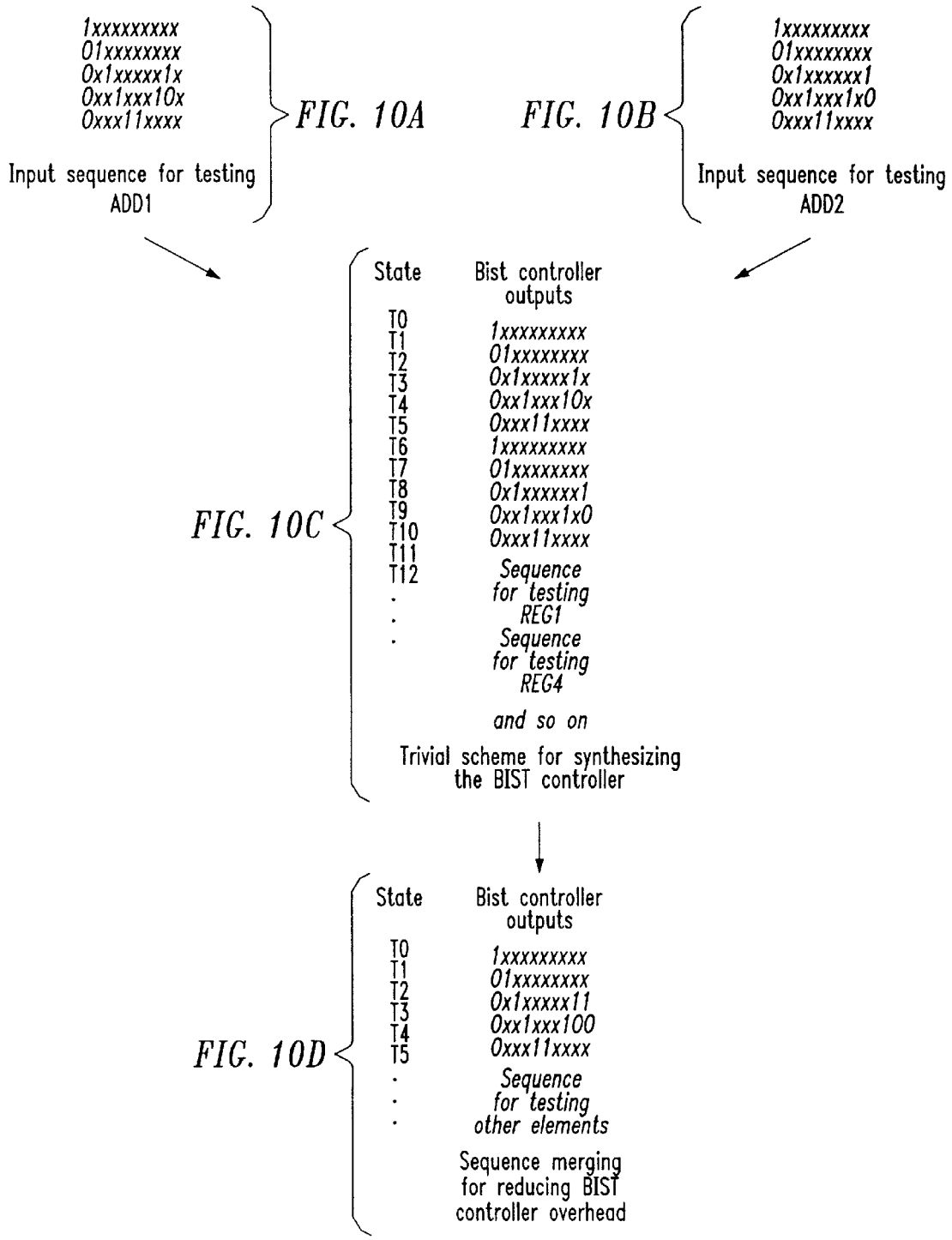
FIGS. 10a–10d show the BIST controller synthesis of the circuit of FIG. 7 according to an embodiment of the invention.

The BIST controller is instrumental in guaranteeing the existence of test environments for all of the RTL elements in the test mode. Using the example circuit of FIG. 7, the external inputs of the controller 70, the status signals and the test multiplexer select signals required to test module ADD1 are shown in FIG. 10(*a*). The signals required to test module ADD2 are shown in FIG. 10(*b*). The BIST controller can be implemented as a finite-state machine (FSM) that generates all of these input signal sequences, one after another. Hence, a trivial way of synthesizing the BIST controller would be to just append the input signal sequences required for the test environments of all of the RTL elements, and derive an FSM for those many cycles as shown in FIG. 10(*c*). In the test mode, each RTL element is tested with a pseudorandom vector from the PRPGs placed at the primary inputs, and the MISRs at the primary outputs, in a sequential fashion. When the BIST controller steps through all of its states, it resets to the first state and then each RTL element gets its second pseudorandom vector, and so on. However, this trivial approach can lead to large overheads. In order to reduce the BIST controller overheads, an attempt to merge the input signal sequences for various test environments is made. For example, the input sequences of ADD1 (FIG. 10(*a*)) and ADD2 (FIG. 10(*b*)) can be merged to simultaneously test both modules with the same pseudorandom vector at the primary inputs (FIG. 10(*d*)). This reduces the number of states in the BIST controller and, consequently, the overhead.

The compaction technique used here is similar to the ones used in test vector compaction for automatic test pattern generation of sequential circuits. First, a test environment and the corresponding controller and test multiplexer input sequence for an untested module are generated. Such a sequence typically has many don't-care values for unspecified signals, as shown in FIG. 10. Using this initial sequence as a constraint, static test compaction techniques are used to merge it with other input sequences to come up with compact sequences. During compaction existing techniques can be used, as for example that disclosed in P. Goel and B. C. Rosales, "PODEM-X: An Automatic Test Generation System for VLSI Logic Structures", *Proc. Design Automation Conf.,* pp. 260–268, June 1981, and in I. Pomeranz, L. N. Reddy, and S. M. Reddy, "COMPACTEST: A Method to Generate Compact Test Set for Combinational circuits," *IEEE Trans. Computer-Aided Design,* pp. 1040–1049, July 1993, both of which are incorporated herein by reference.

The P. Goel et. al., article discloses multiple test generation algorithms and techniques which are integrated into a unified system which has successfully produced tests for unpartitioned LSSD logic structures of up to 50,000 logic gates. The individual tests produced by the deterministic test generator are such that they may be compacted into a fewer number of tests using the static tests compaction procedure. Three distinct sources of tests are used. A modified but functionally generated shift register test, the Random Path Sensitization (RAPS) test generator, and the PODEM test generator. The PODEM algorithm was selected because it has been shown to be faster than the D-Algorithm for most combinational logic structures and, therefore, for LSSD logic structures. The shift register tests and the RAPS tests are fault simulated as they are generated, one at a time. The PODEM test generator is applied in two modes: (1) in which a dynamic test compaction approach is used in the test generator so that each compacted test is fault simulated as soon as it is generated, and (2) in which independent tests are generated for untested faults, with the independent tests being individually fault simulated and subsequently compacted using the static test compaction technique. The fault simulation method employed is termed the fast fault simulator. The use of the term fast signifies that speed is gained at the expense of accuracy.

The Pomeranz et. al., article discloses a test generation procedure for single stuck-at faults which combines the high fault coverage achievable by existing test generation procedures with heuristics which are directly aimed at obtaining small test sets. These heuristics include the use of independent faults for fault ordering, a test compaction method that leads to tests that detect large numbers of faults, and a dynamic line justification method, again aimed at the detection of as many faults as possible by a single test vector. The heuristics employed can be added to any existing test generation procedure. The extended test generation procedure, which includes the proposed heuristics, is comparable in run time and fault coverage to the original test generation procedure.

During test environment generation for a module, the module is also checked as to whether other RTL elements such as registers and multiplexers get tested in the process. For example, it will be seen that while testing module ADD1 in the Barcode circuit of FIG. 7, registers REG1 and REG4 also get tested with the same test environment. This is because in the test environment, there exists at least one variable that is mapped to each of these registers and which is controlled from a primary input and observed at a primary output. In such cases, separate test environments are not generated for testing these registers; this too is useful in reducing the BIST controller overhead.

The herein-described scheme assumes that all RTL elements are tested with the same number of pseudorandom vectors. This may not, however, be the best from a test application time point of view, since the number of vectors needed to test an element or a combination of elements (in the case of merged test environments) will most probably be unequal. This problem can be rectified at the expense of some additional test overhead by making the BIST controller more sophisticated. In this case, each test environment (or combination of test environments) input sequence can be encased in a loop to be executed for a fixed number of pseudorandom vectors, which may require some additional counter and decode logic or an extra test pin to signal the end of a test session. However, for simplicity of exposition, the BIST controller is assumed to be implemented as herein described.

Circuits with Mixed Control-Data Flow Disclosure and Non-Uniform Bit-Widths

To this point in this disclosure of the invention, it has been assumed that the circuit under test had a separate data path and controller and that the data path bit-width was uniform. This may not, however, always be the case, and the application of the inventive BIST technique to RTL circuits where data and control flow are mixed and the bit-width of the data path is non-uniform will accordingly now be described. Indeed, these types of circuit designs appear quite frequently in the industry; data and control information may be chained to increase the performance of the circuit, and bit-widths along a data path vary as a function of the precision required at a particular point in the computation. The only assumption now made is that a reset state is present in the controller of the circuit.

In order to provide a BIST scheme in accordance with the invention for circuits having mixed control-data flow and non-uniform bit widths, a preprocessing step is added to the method described hereinabove to first separate the data and control flow information in the circuit. This is done purely for analysis without modifying the actual circuit and can lead to a large increase in the number of states in the controller thus derived, thus considerably increasing the complexity of testability analysis. Hence, some additional techniques are used to reduce the number of states in this controller. The remainder of the inventive technique is then as described hereinabove. The CVO transformation rules are also modified to accommodate the variation in bit-width in different parts of the circuit. These are stored in a library and the variation in the bit-width of the data path is addressed by making the CVO transformations library-based.

RTL Circuits with Mixed Control/Data Flow

In order to test an RTL circuit using its controller netlist and the data path connectivity, a set of behaviors executing on the data path must first be extracted and symbolic justification and propagation performed thereon for testability analysis. This procedure was explained hereinabove, but requires strict separation between the data and control in the circuit. Hence, to tackle circuits where data and control are mixed, the data flow must be separated from the control flow for testability analysis.

Modifying The Controller To Separate Data and Control

Figures 11, 12:
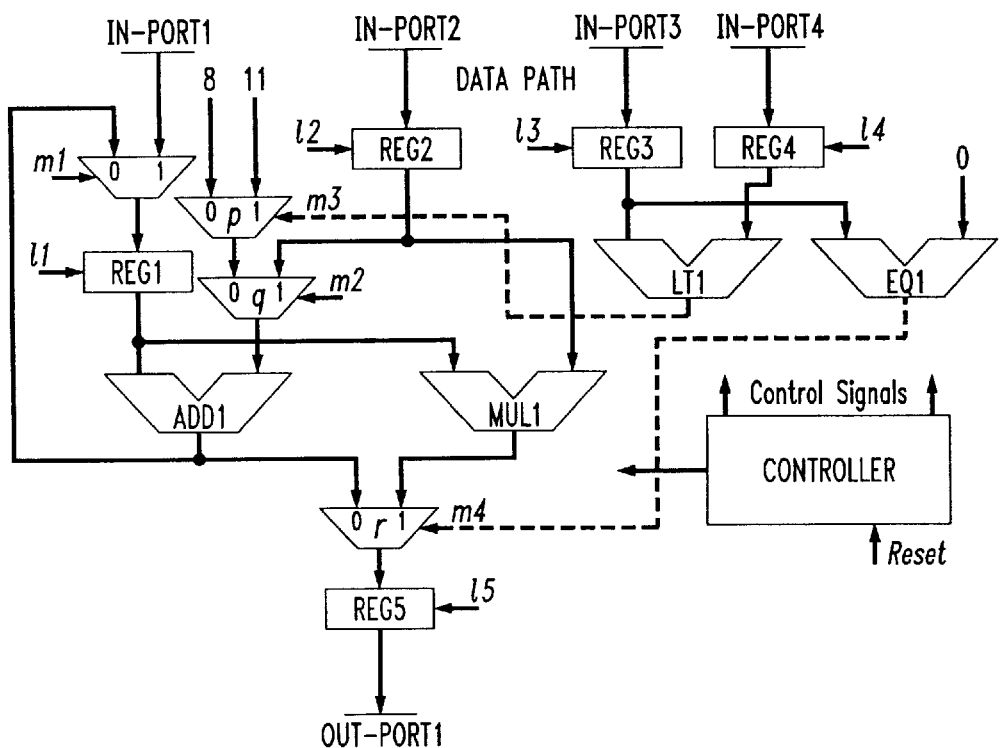
FIG. 11 is a schematic diagram of another exemplary RTL circuit with mixed control/data flow used to further describe the disclosed method for testing RTL controller/data paths using BIST according to the invention.
FIG. 12 is a diagrammatic representation of the behavior executed in the circuit of FIG. 11.
Figures 13, 14:
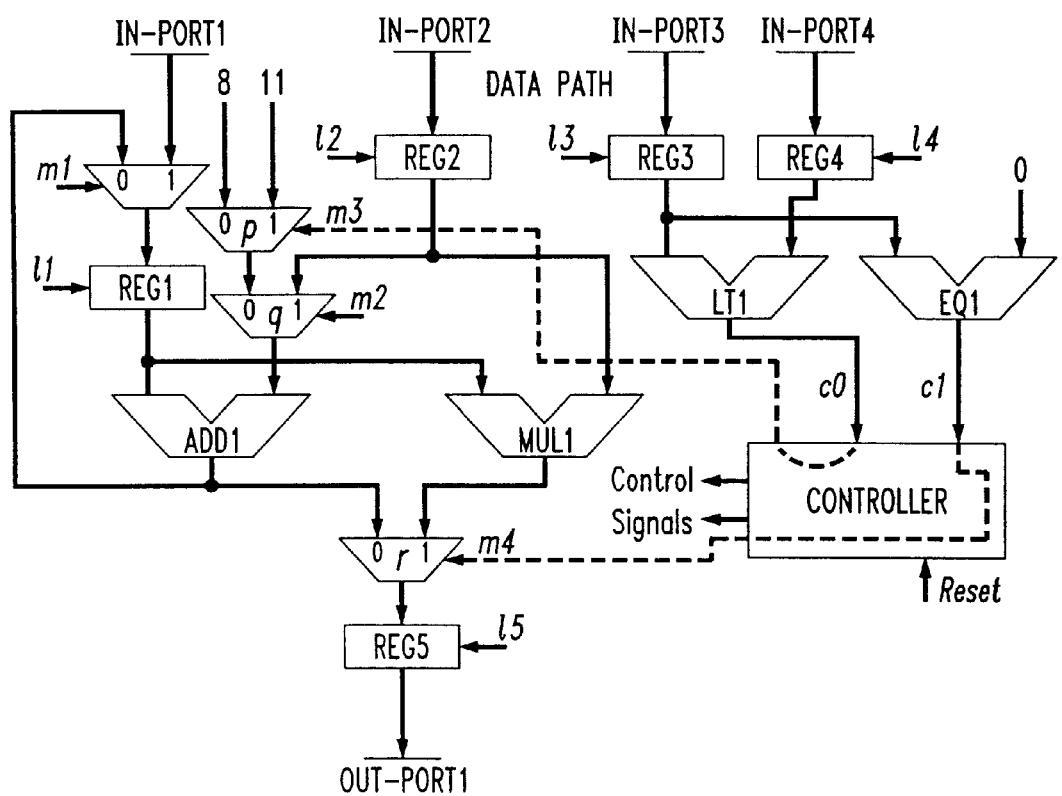
FIG. 13 is a state table extracted from the logic-level netlist of the controller of the circuit of FIG. 11.
FIG. 14 is a schematic diagram of the circuit of FIG. 11 showing the separation of the data flow from the controller in accordance with the present invention.

Referring now to the RTL circuit shown in FIG. 11 (Chainedckt), ADD1 is an adder, MUL1 is a multiplier, LT1 is a less-than comparator, and EQ1 is an equal-to comparator. The data path has a uniform bit-width of 16 and executes the behavior shown in FIG. 12. However, it is assumed that the behavior is not known to us beforehand and that only an RTL data path netlist and the logic-level netlist of the controller are available. This assumption reflects the typical real-life situation in the industry. In the circuit, the status signals generated by the data path are directly fed as control signals to the data path elements (shown by the dashed lines); this is also known as control/data chaining. There is accordingly no clear separation between the data flow and control flow. The first step in the process is to extract the controller behavior from the controller circuit, which is assumed to be a logic-level netlist. FIG. 13 shows the state table obtained from the controller circuit.

Typically, the status signals of a data path are generated by the comparator outputs, ALU flags, etc. In a design having a separate data path and controller, these signals are fed as inputs to the controller which, in turn, generates the necessary control signals to be fed to data path elements. The aim is to convert the circuit with mixed control/data flow into a similar design style, which results in the design shown in FIG. 14. Note that the circuit is not physically changed, but is rather modified solely for purpose of the analysis. Formally, each data path control signal such as multiplexer select, tri-state control, register load, ALU select, etc. is examined and traced back to the source. If the source is not the controller, then these signals are rerouted through the controller. If these signals are combined through logic gates in the data path, then these logic gates are also included in the modified controller and the controller behavior is modified accordingly. A set of new controller inputs and outputs are thus formed.

This procedure may appear simple, but the effect of this conceptual change on the controller is dramatic. Since the controller of FIG. 14 now has two extra inputs (c0 and c1), each state has four distinct input/output possibilities. Thus, the size of the controller state table increases four times, as shown in FIG. 15. If there are n new controller inputs, then the size of the controller will increase by a factor of 2n. Since the testability analysis is performed by extracting the behavior executed by the data path using the controller state table, the complexity of the analysis will increase exponentially unless something is done to reduce the number of input/output possibilities in the state table.

As it turns out, all status inputs to a controller are not important in changing the control or data flow in all states. Only a small subset of the total is used in each state and the other signals are "don't cares" for that state. This fact is utilized to reduce the total number of input/output possibilities in the controller, and thus considerably reduce (prune) the state table size.

Pruning the Controller State Table

The underlying principle behind controller pruning is to determine whether a new output signal of the controller is doing any useful work in a particular state, i.e. whether the data or control flow in the circuit changes as a result of a change in the value of the signal. Referring to FIGS. 14 and 15, consider by way of example controller state S0. The new output signals in the modified controller are m3 and m4. In state S0, output m3 is controlling the data flow through multiplexer p. However, the output of p is the 0-select input to multiplexer q which transfers its 1-select input in the state (since m2 is 1). This means that output m3 is a "don't care" in this state as it has no effect on useful data flow. Consequently, input c0 on which m3 depends becomes a "don't care" in state S0; this result reduces the input/output possibilities in the state table by two.

Next, consider output signal m4 in state S0. Signal m4 selects the multiplexer input to register REG5. However, REG5 does not load in S0. Hence, it is of no consequence how its input is selected. Thus m4, and hence input c1on which m4 depends, is also a "don't care" in state S0, reducing the size of the state table still further.

This type of data and control flow analysis is carried out for each state, and the "don't care" input/output combinations are identified, thus reducing the size of the modified controller state table drastically. The following rules are used to identify "don't cares" and to prune the state table.

- If a new controller output feeds the select signal of a multiplexer or tri-state gate, and subsequently the output signal of that multiplexer or tri-state gate is not selected in some state, then the controller output signal value is a "don't care" for that particular state. In order to perform this analysis, it may be necessary to descend a multiplexer tree or a bus structure until the final destination for the data is reached.
- If a new controller output feeds the select signal of a multiplexer or ti-state gate, and subsequently the output signal of that multiplexer or tri-state gate reaches a data storage element such as a register or register file and the write signal of that storage element is inactive in some state, then the controller output signal value is a "don't care" for that particular state.
- If a new controller output feeds the select signal of an ALU or shifter, and the output of that ALU or shifter is not loaded into a data storage element in some state, then the controller output signal value is a "don't care" for that particular state.

For the circuit in FIG. 14, after the above rules are applied, the state table size reduces to only six lines which is a mere 50% larger than the original state table; this is shown in FIG. 16. After this preprocessing step, the rest of the testing process is the same as that explained hereinabove.

RTL Circuits with Non-Uniform Bit-Width

Figure 17:
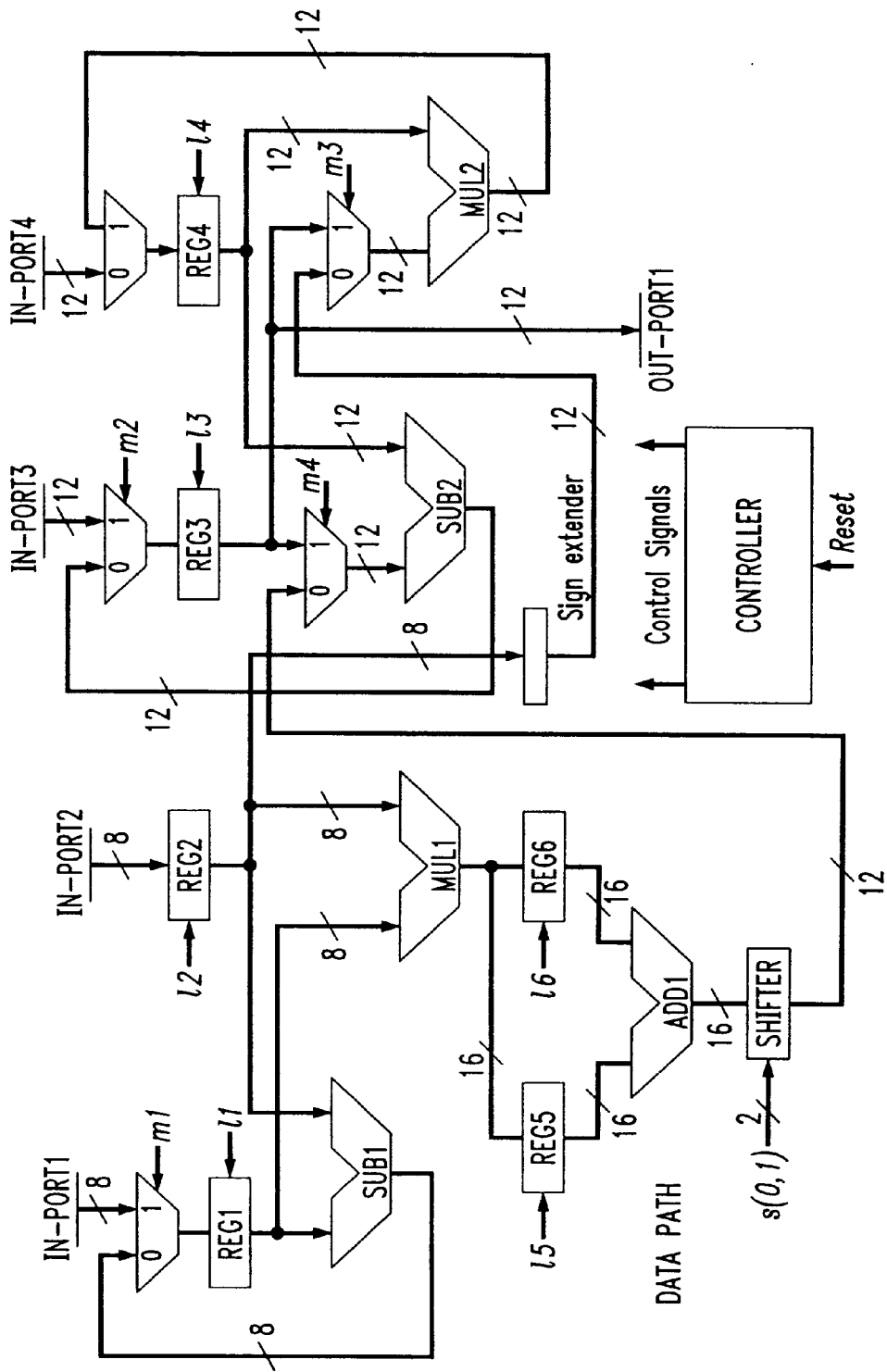
FIG. 17 is a schematic diagram of another exemplary RTL circuit having non-uniform bit-widths in the data path.

This section demonstrates how hierarchical testability analysis techniques can be used to test RTL data paths having non-uniform bit-widths. These types of designs occur frequently due to the truncation or expansion of variables as a function of the precision required at particular points in the computation. FIG. 17 shows such a circuit (Multibit). The data path consists of three different bit-widths—8, 12 and 16 bits. Multiplier MUL1 has two 8-bit inputs and a 16-bit output, and multiplier MUL2 has two 12-bit inputs and an output truncated to the least significant 12 bits. The SHIFTER module is a barrel shifter which truncates its 16-bit input to a 12-bit output depending on the values at signal s. When s has a value 00, the least significant 12 bits of the input are passed to the output, i.e. input bits 0 to 11 whereas when s is 11, the most significant 12 bits of the input are passed to the output. When s is 01 (10), the input bits 1 to 12 (3 to 14) are passed to the output. The sign extender extends the sign of the 8-bit input value to a 12-bit output value.

Figure 18:
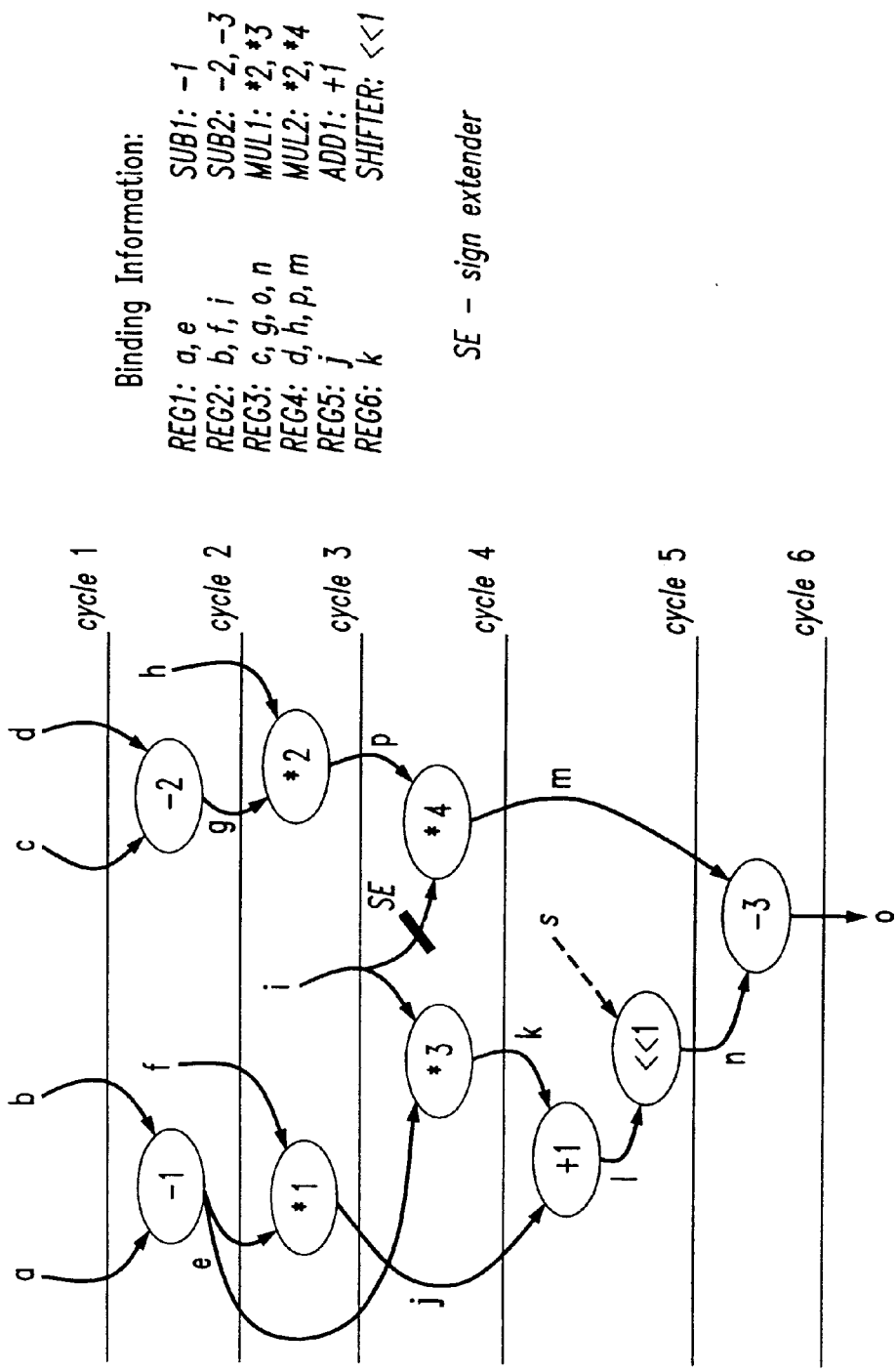
FIG. 18 is a diagrammatic representation of the TCDF extracted from the RTL circuit of FIG. 17.

The TCDF executed on the RTL circuit is extracted by the procedure explained earlier and is shown in FIG. 18. Shift operation <<1 is modeled using a control edge indicated by the dashed line since the value at the output of the SHIFTER is dependent on the value of signal s.

The symbolic justification and propagation steps explained earlier herein can be further modified to accommodate RTL circuits with non-uniform bit-widths, as by way illustrative example the module ADD1 of FIG. 17. In order to test ADD1, operation +1 in the TCDF, which is mapped to ADD1, has to be tested, as will now be explained.

The initial objectives are $Cg(\alpha)$ of j and $Cg(\alpha)$ of k, and $Ov(\alpha+1)$ of l. $Cg(\alpha)$ of k is transformed through operation *3 to $Cg(\alpha-1)$ of i and $Cg(\alpha-1)$ of e. The rules for transforming CVO objectives through RTL modules are stored in the module library together with other library information. These rules change to tackle bit-width mismatch in the data path. Thus, for MUL1 to which *3 is mapped, a Cg(α) requirement at its output is transformed to Cg((α−1) requirements at both its inputs since both 8-bit input values need to be controlled to arbitrary values to obtain an arbitrary value at its 16-bit output. However, in the case of MUL2, a Cg(α) requirement at its output is transformed to Cg(α−1) at its left input and C1(α−1) at its right input, or vice versa. In this case, since the inputs and output are all 12-bits wide, controlling the value at one input to a constant 1 is enough to transfer the value at its other input to the output.

Cg(α−1) of i is trivially achievable as it is an input variable. Cg(α−1) of e is transformed first to Cg(α−2) of e and then to Cg(α−3) of a and Cq((α−3) of b through operation −1. Both these objectives are trivial as they are primary input variables. Cg (α) of j is transformed first to Cg(α−1) of j and then to Cg((α−2) of e and Cg(α−2) of f through operation *1. Cg(α−2) off is again trivial as it is an input variable. However, Cg(α−2) of e leads to a conflict as it has been used earlier and a variable cannot be controlled to two different values at the same time. Since there are no other options and the search is not able to backtrack, a test multiplexer is added to and control j directly from the primary inputs in the test mode.

Ov(α+1) of i is transformed through operation <<1 to Ov(α+1) of n and Co(α) of s, and also to Ov(α+1) of n and Cα1(α) of s. This is another transformation stored in the library. Since there is no way of observing at one time all 16 bits of the input to the SHIFTER at its output, the library forces the simultaneous use of two transformations: once with the value of s at 00 so that the least significant 12 bits of the input can be observed, and once with the value of s at 11 so that the most significant 12 bits of the input can be observed. This means that each test vector of ADD1 will have to be applied twice so that different parts of its output can be observed using different values of s. These values of s are obtained with the help of two 2-bit test multiplexers which provide the necessary constant values in the test mode. Finally, Ov(α+1) of n is transformed to Ov(α+2) of o since the fault effect at the input of a subtracter will always be transferred to its output irrespective of the value at its other inputs. Ov(α+2) of o is trivial as it is a primary output variable. In this manner, a test environment for adder ADD1 has thus been obtained.

Justification transformations from the output to the input of a sign extender are prohibited in the case of a Cg requirement as all possible values cannot be justified at its output from its input. However, propagation of test responses through it is allowed since the value at the input is transferred to the output only with a sign extension, thereby allowing fault effects to propagate. Using the method explained above, library-based symbolic justification and propagation are used to test all other RTL elements in the circuit. RTL testing can thus be performed even if the data path has non-uniform bit-width.

Imposing a BIST Architecture (Step 28 of FIG. 1)

Once the BIST controller is synthesized, the test hardware is integrated with the original RTL circuit to facilitate its testing in BIST mode by imposing a BIST architecture on it.

Figure 19:
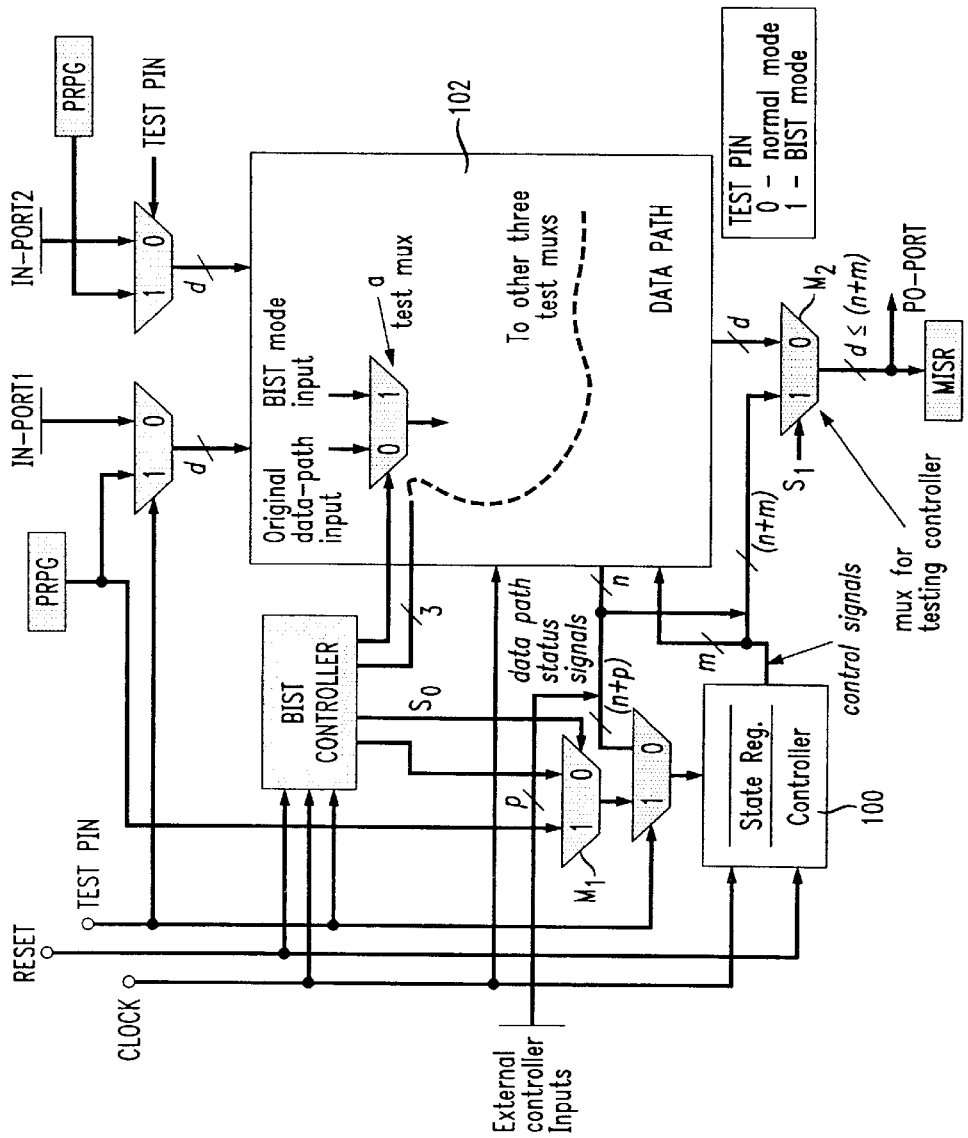
FIG. 19 is general schematic representation of the BIST architecture according to an embodiment of the present invention.

A low-overhead solution to this problem is shown in FIG. 19. In this figure, the added test hardware is shaded gray (one extra TEST PIN is assumed to provide the Test mode signal). The controller outputs are multiplexed via mux M2 with a data path primary output port to facilitate testing of the controller. Multiplexer M2 does not result in a delay overhead, as the delay of a multiplexer or even a multiplexer tree at the output of a primary output register is usually much less than the clock period.

In case of control-flow intensive circuits, the status signals are made directly observable by multiplexing the status signal lines from data path 102 with an output port, and are made controllable during BIST mode by feeding the status inputs of the controller 100 from the BIST controller. The BIST controller is activated during test mode by the TEST PIN. The reset signal is connected to the reset pin of the BIST controller (recall that only these two controller state registers are assumed to be resettable; none of the data path registers are assumed to be resettable). The BIST controller feeds: (i) the select signals of the test multiplexers that are added to the circuit, and (ii) two bits S0 and S1 that control the select signals of multiplexer M1 and the output multiplexer M2, respectively. In the test mode, the BIST controller provides the test multiplexer select signals to reconfigure the circuit and provide controllability and/or observability as required by a test environment. It also provides the input signals to controller 100 to ensure the correct control/data flow configuration as required by the test environment. In the normal mode, the test-multiplexer select lines are 0. Hence, the normal data path configuration exists. The Test signal and signals S0 and S1 should also be 0 for normal operation.

The foregoing configuration can be used to test the entire circuit where the data path 102 and the controller 100 are tested separately. In the test mode, the TEST PIN is set. While testing the data path 102, the BIST controller gives a suitable control flow which is achieved by controlling the input signals to controller 100 to a desired sequence. Signals S1 and S0 are both set to 0 for testing those data path elements other than the ones that produce the status signals for the controller. At specified cycles, the data path 102 must be reconfigured using the test multiplexers. The BIST controller also provides these signals. While testing the data path elements that produce the status signals, such as comparators, the status signals coming out of the data path must be observed to obtain full observability of the element outputs. In this case, the BIST controller generates signals S1 and S0 as 1 and 0, respectively. At each cycle, pseudo-random vectors are fed into the primary input ports from PRPGs and the outputs captured at the primary output ports with MISRs.

While testing the controller 100, the controller 100 inputs are directly controlled using the PRPG at the primary input port. The controller outputs can be directly analyzed by the MISR at the primary output port. The BIST controller asserts signals S1 and S0 to obtain this particular configuration, i.e. S1=S0=1. In some rare cases, the sum of the number of controller output bits and the status output bits (n+m) may exceed the number of output bits (d) of the data path 102; in that case, the MISR width at the output port is increased to capture these extra bits.

Though the preceding discussion has assumed edge-triggered flip-flops and a single-phase clock, similar analysis can demonstrated as applicable to multi-phase and level-triggered clocking schemes as well. In addition, in the method of the present invention, unlike many previous high-level BIST and synthesis for testability methods, there is no assumption of any independent control over the controller outputs (i.e. no scan at the controller/data-path interface). The data path is actually tested by following the data flow dictated by the controller. Since all of the tests can be fed at the normal clock speed of the circuit, at-speed testability is also rendered possible. And although the controller and data path are tested separately, a fault occurring on the control lines gets detected with a high probability since the data flow dictated by the controller is used to test the data path (any change in the data flow due to control line faults is likely to cause errors at the primary outputs).

Finally, it is frequently possible to convert existing input registers (registers connected to primary input ports) to PRPGs, and output registers (registers connected to primary output ports) to MISRs, instead of adding additional PRPGs and MISRs. This reduces the overhead even further, but can only be done if the occurrence of a circular path can be avoided in the BIST mode; in other words, the input and output registers should not be involved in a circular path in any test environment. For example, in the RTL circuit of FIG. 4, input registers REG5 and REG6 can be converted to PRPGs whereas in the RTL Barcode circuit of FIG. 7, output registers REG4 and REG5 can be converted to MISRs.

Experimental Results

Figure 20A:
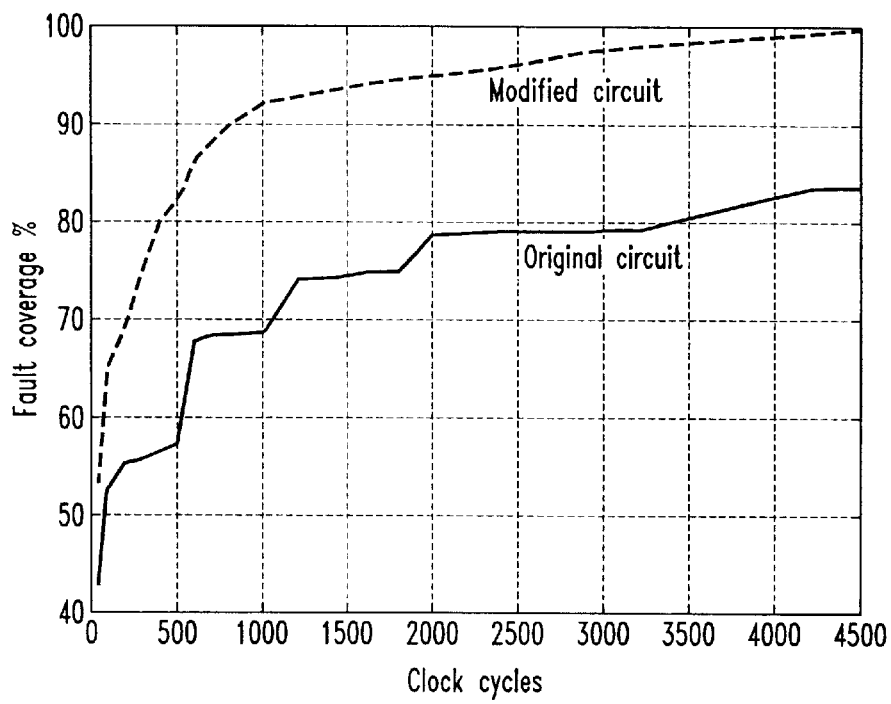
FIGS. 20a–20h are graphical representations showing the fault coverage curves for six exemplary circuits before and after modification in accordance with the method of the present invention.
Figure 20B:
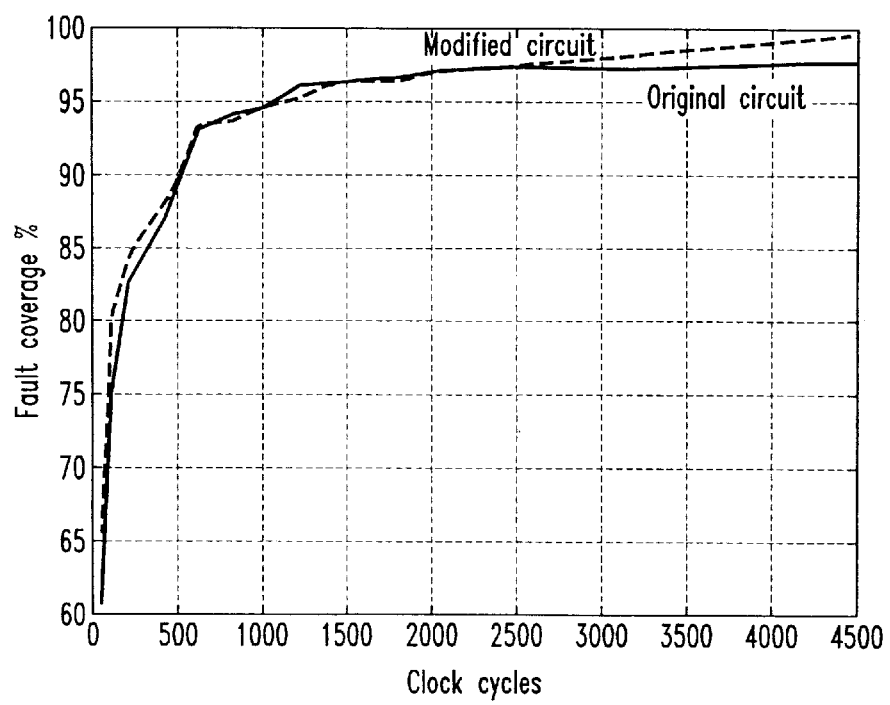
Figure 20C:
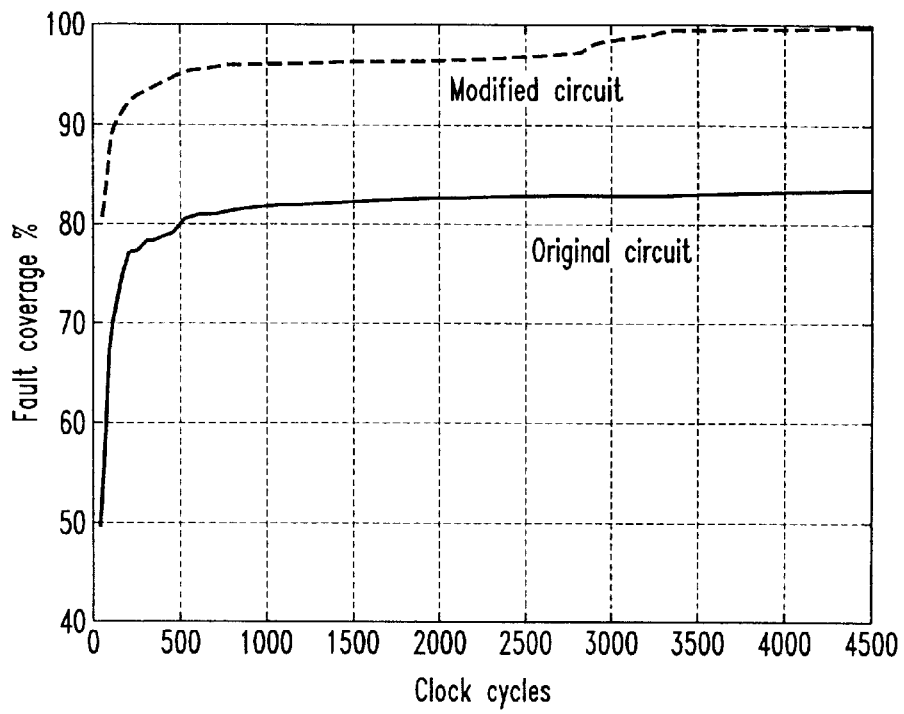
Figure 20D:
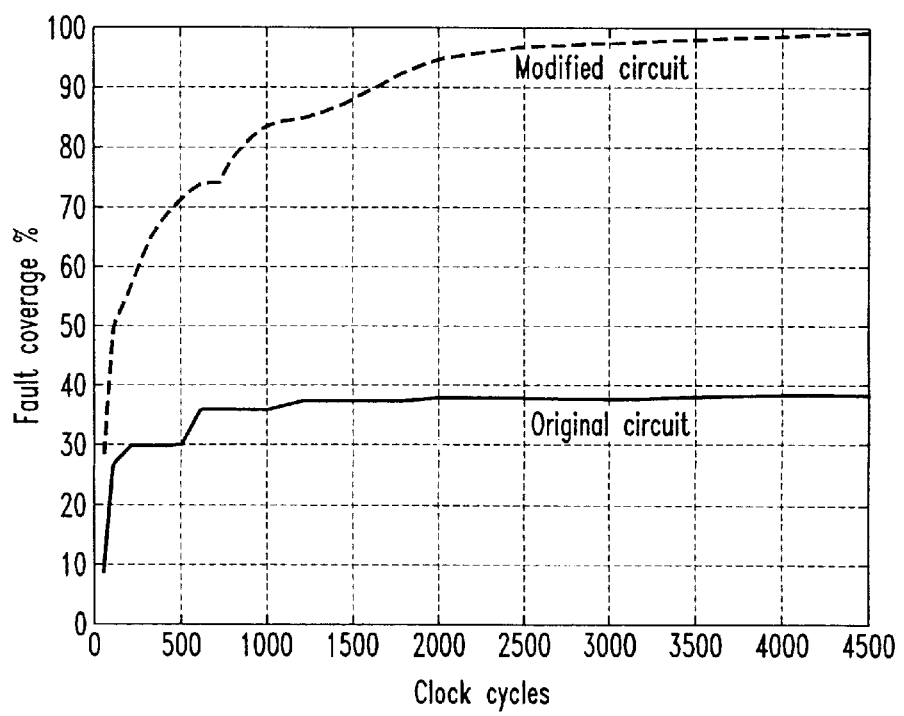
Figure 20E:
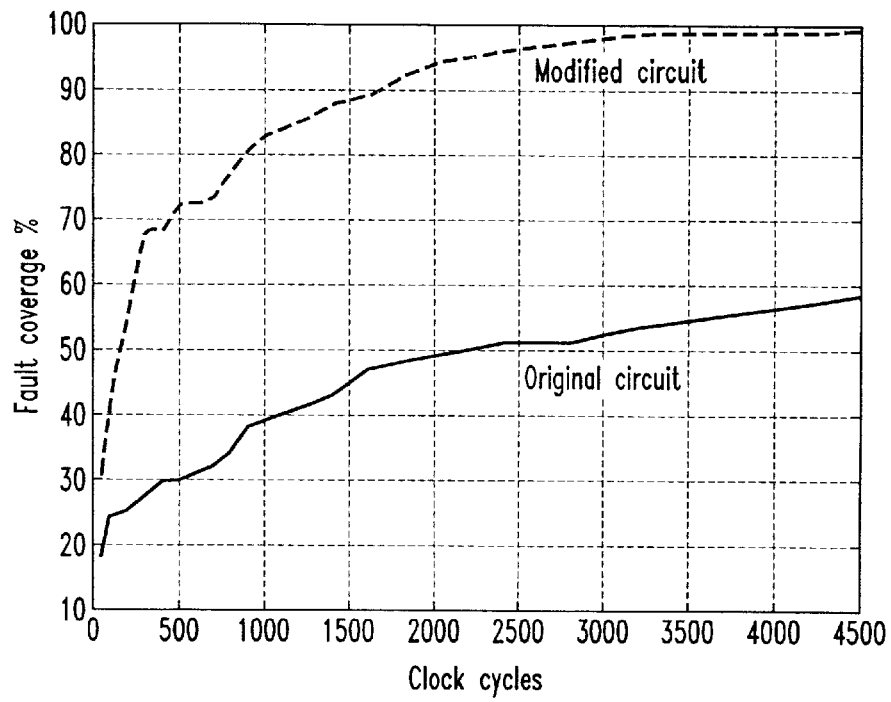
Figure 20F:
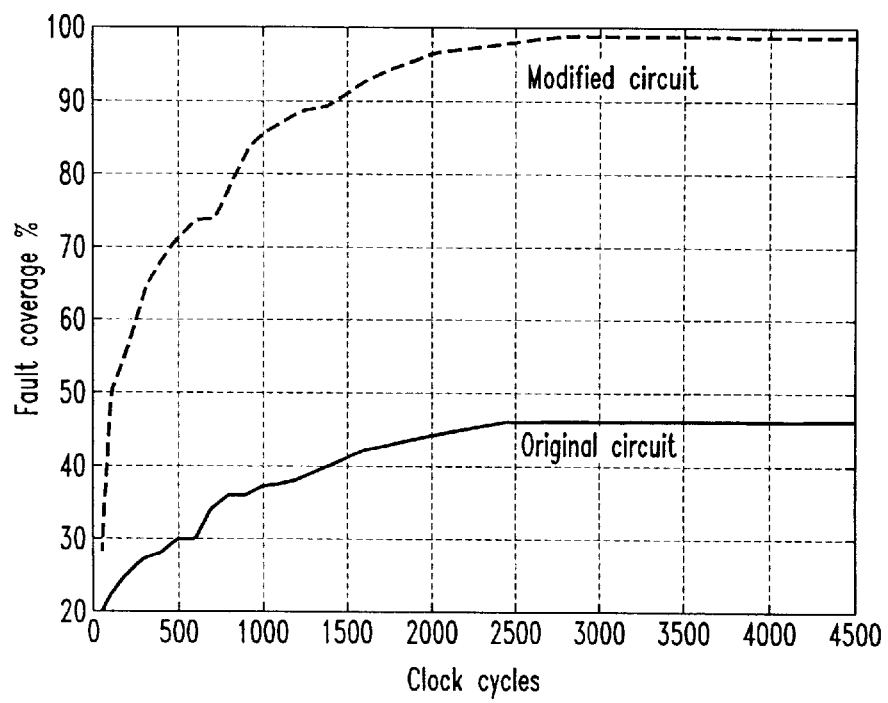
Figure 20G:
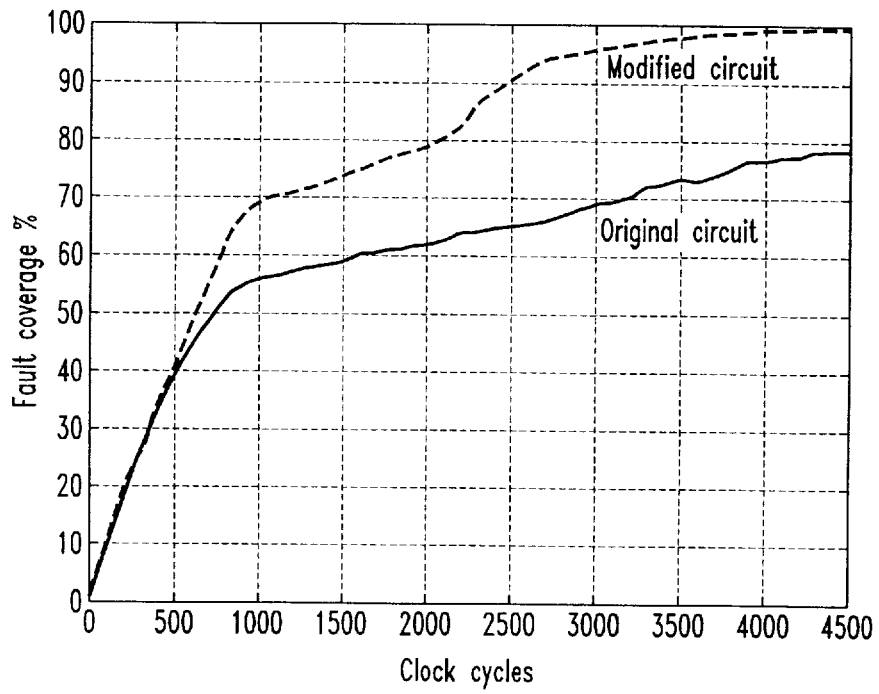
Figure 20H:
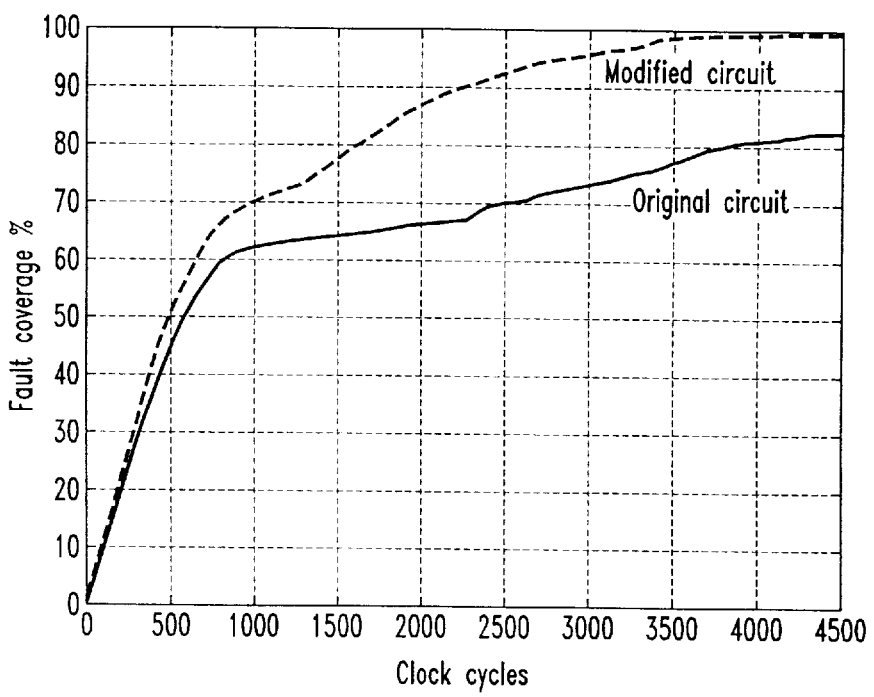

FIGS. 20a–20h show graphical representations of experimental results obtained by applying the method of the present invention to various known circuits. In each figure, the solid line represents the fault coverage of the original circuit, and the dotted line represents the fault coverage of the modified circuit after applying the BIST scheme of the invention. FIG. 20(a) shows the results for the popular benchmark circuit (Tseng) shown in FIG. 4. FIG. 20(b) depicts the results when the BIST scheme of the present invention is applied to the Paulin circuit disclosed in L. Avra, "Allocation and Assignment in High-level Synthesis for Self-Testable Data Paths," Proc. Int. Test Conf., pp. 463–471, June 1991, incorporated herein by reference. FIG. 20(c) shows the results of the application of the BIST scheme of the present invention to a greatest common divisor (GCD) circuit, which is a control-flow intensive circuit that computes the GCD of two numbers; this circuit is well known in the art. FIG. 20(d) shows the resulting fault coverage when the Barcode circuit of FIG. 7 is modified using the BIST scheme of the invention. FIGS. 20(e) and 20(f) show the fault coverage improvement in two circuits identified as Amvabs and Amvdual, respectively, that are subcircuits of an industry designed MPEG decoder. The area, delay and power results were obtained after technology mapping the gate-level implementation of the RTL circuits using the stdcell22.genlib cell library in the SIS logic synthesis system. FIG. 20(g) depicts the fault coverage for the Chainedckt circuit shown in FIG. 11, and FIG. 20(h) the fault coverage for the Multibit circuit shown in FIG. 17.

TABLE 3

Circuit size and DFT hardware statistics

| Circuit | Bit-width | # literals | # flip-flops | # 16-bit test muxs | CPU Time (sec.) |
|---|---|---|---|---|---|
| Tseng | 16 | 5246 | 100 | 1 | 27.5 |
| Paulin | 16 | 6826 | 116 | 1 | 3.5 |
| GCD | 16 | 1329 | 50 | 0 | 0.0 |
| Barcode | 16 | 1518 | 84 | 2 | 1.3 |
| Amvabs | 12 | 1456 | 40 | 1 | 0.8 |
| Amvdual | 12 | 2056 | 46 | 1 | 0.9 |
| Chainedckt | 16 | 3837 | 83 | 1 | 0.4 |
| Multibit | non-uniform | 4685 | 75 | 1.25 | 1.6 |

Figure 21:
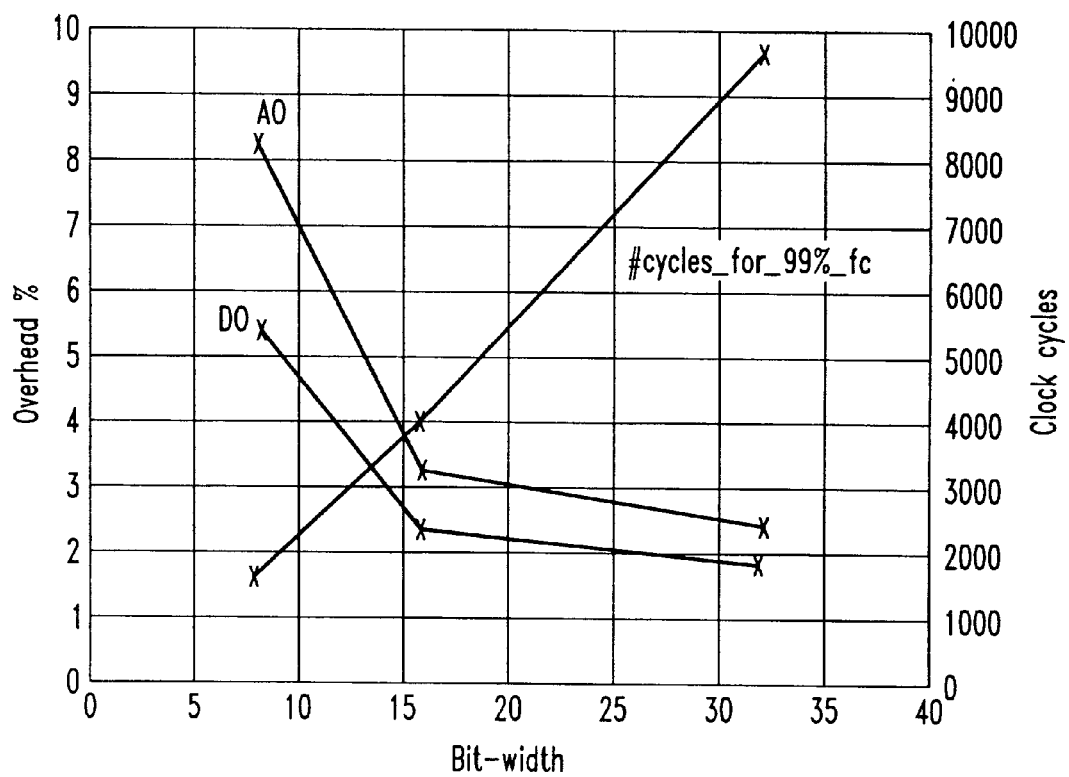
FIG. 21 is a graphical representation of the effect of bit-width on BIST architecture parameters according to the present invention.

Table 3 lists the characteristics and specifications of these various circuits. The BIST overheads are reported in Table 4, and the testability results are shown in FIG. 21. In Table 3, Column 2 reports the bit-width of the circuit data paths. In Columns 3 and 4, the literal-counts of the original technology-mapped circuit and the number of flip-flops, respectively, are listed. The number of 16-bit test multiplexers added to the data path by the DFT procedure is listed in Column 5; it should be noted that this number merely indicates the number of extra multiplexers in the data path and does not include the multiplexers in the BIST architecture which are added by default to all circuits, and which have been taken into account in calculating the overheads in Table 4. The number is fractional if the number of single-bit test multiplexers used in the data path is not an integral multiple of 16. This kind of situation arises frequently when dealing with circuits with non-uniform bit-width. In column 6, the CPU time required for symbolic testablity analysis is listed in seconds, as obtained on a SparcStation 20 with 256 MB DRAM. (SparcStation is the computer (Sparc Workstation) on which these experiments were performed. It is manufactured by Sun microsystems and is a standard computing platform for computer aided design applications.) Since the analysis is symbolic, it is independent of the bit-width of the data path. Hence, the testability analysis time will remain the same for 32-bit wide data paths. This is a major advantage over many previous testability analysis schemes in which the CPU time for analysis drastically increases with increases in the data path bit-width.

Column 2 of Table 4 indicates the original area of the circuits after technology mapping. This is a relative figure obtained from the layouts of the standard cells used, and hence has no units. Column 3 shows the area after the circuits have been modified by the BIST architecture and hardware. The area overhead is primarily a result of the extra PRPGs and MISRs, the BIST controller, the Test pin, the additional logic for rendering the comparators random-pattern testable, and test multiplexers in the data path and BIST architecture. The percentages of overhead are given in Column 4. In Columns 5, 6 and 7, the corresponding figures for delay are provided, representing the clock period in nanoseconds.

TABLE 4

DFT hardware placement overheads

| | Area | | | Delay | | |
|---|---|---|---|---|---|---|
| Circuit | Orig. | Mod. | Ovhd. (%) | Orig. (ns) | Mod. (ns) | Ovhd (%) |
| Tseng | 586454 | 60531 | 3.2 | 70.2 | 71.8 | 2.3 |
| Paulin | 72345 | 74443 | 2.9 | 74.3 | 75.7 | 1.9 |
| GCD | 16734 | 18893 | 12.9 | 55.3 | 56.9 | 2.9 |
| Barcode | 20516 | 23573 | 14.9 | 34.2 | 35.9 | 5.0 |
| Amvabs | 19564 | 21168 | 8.2 | 29.7 | 30.2 | 1.7 |
| Amvdual | 28765 | 31728 | 10.3 | 32.3 | 32.9 | 1.9 |
| Chainedckt | 46576 | 51001 | 9.5 | 154.0 | 157.2 | 2.1 |
| Multibit | 59350 | 63386 | 6.8 | 116.6 | 120.3 | 3.2 |

The average area and delay overheads are 6.9% and 2.5%, respectively (the average is calculated based on total area/delay of all of the examples for the original and modified cases). The area and delay overheads are much smaller than in conventional BIST techniques by virtue of the utilization of functional information and existing data and control flows of the circuit.

The graphs of FIG. 20 show the testability results for the original circuits (without any testability hardware) and the circuits augmented by the inventive BIST scheme. The fault coverage numbers are obtained by fault simulating the pseudorandom patterns from the PRPGs (liner feedback shift registers were used as PRPGs) on the modified circuit using a program entitled "PROOFS", described in T M. Niermann, W. T. Cheng, and J. H. Patel, "PROOFS: A fast, memory efficient sequential circuit fault simulator,"*Proc.*

*Design Automation Conf.,* pp. 535–540, June 1990, incorporated herein by reference. The fault coverage numbers obtained by the inventive method are above 99% for all of the examples (with a minimum of 99.1% at 4,500 cycles for Amvdual and a maximum of 99.7% for Paulin), and the number of test cycles required to get over 99% fault coverage is never more than 4000.

To determine whether most of the untested faults in the original circuits are random-pattern resistant, the number of clock cycles was increased to 40,000. By thus increasing the clock cycle, the increase in fault coverage (as compared to fault coverage at 4,500 clock cycles) for the original circuits of Tseng, Paulin, GCD, Barcode, Amvabs, Amvdual, Chainedckt and Multibit was only 2.1%, 0.3%, 3.2%, 4.0%, 3.2%, 5.5%, 4.6% and 4.3%, respectively. This demonstrates the highly advantageous functionality of the inventive BIST scheme over those of the prior art.

In order to see how different parameters vary with a change in bit-width, the BIST architectures for 8, 16 and 32 bit wide data paths of the exemplary circuit of FIG. 4 (Tseng) have been evaluated. FIG. 21 shows area overhead (AO), delay overhead (DO), and number of cycles required to attain 99% fault coverage (#cycles_for_99%_fc) with this varying bit-width. Similar results were obtained for other examples as well. Since the testability hardware does not scale as quickly as the data path size, the AO and DO curves are predictable. The obtained almost linear increase in #cycles_for_99%_fc indicates a substantially linear relationship between clock cycles and bit-width.

Thus, while there have been shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those method steps which perform substantially the same function in substantially the same way to achieve the same result are within the scope of the invention. It is the intention, therefore, to be limited only as indicated by the scope of the claims appended hereto.

We claim:

1. A method for implementing a BIST scheme in an integrated circuit for testing RTL controller data paths in the integrated circuit, comprising the steps of:

extracting a state table from a controller netlist of a controller circuit within the integrated circuit;

selecting untested RTL elements from an RTL circuit in the integrated circuit;

extracting test control and data flow (TCDF) information for the selected RTL elements from the extracted state table, controller netlist and a data path of the circuit;

performing a symbolic testability analysis of the extracted test control and data flow information to derive a test environment;

identifying a controller input sequence for the derived test environment;

modifying an existing controller input sequence of the integrated circuit with the identified controller input sequence;

synthesizing a BIST controller from the modified controller input sequence; and modifying the integrated circuit with a BIST architecture having the synthesized BIST controller and the controller input sequence for testing of the integrated circuit.

2. The method set forth in claim 1, wherein said step of extracting a state table comprises the steps of:

identifying RTL circuits within the integrated circuit having mixed control/data flow;

extracting information relating to controller behavior from a controller circuit of the integrated circuit;

examining each data path control signal within the identified RTL circuit to determine its source;

re-routing through the integrated circuit controller circuit the data path control signals for which the controller circuit is not the determined source; and generating a new set of controller inputs and outputs corresponding to the re-routed data path control signals.

3. The method set forth in claim 1, wherein said step of extracting test control and data flow information comprises the steps of:

extracting operations executed in each operating cycle of the integrated circuit; and maintaining a record of all variables present in each register and latch of the integrated circuit in each of the operating cycles.

4. The method set forth in claim 1, wherein said step of performing a symbolic testability analysis comprises adding test multiplexers to the data path to increase controllability and observability of the integrated circuit at points in the integrated circuit at which testability bottlenecks have been identified.

5. The method set forth in claim 1, wherein said step of synthesizing a BIST controller comprises the steps of:

generating all input signal sequences to the integrated circuit;

merging the generated input signal sequences for various test environments to reduce BIST controller overhead; and applying the merged input signal sequences to primary inputs of the integrated circuit in the form of pseudo-random vectors.

6. The method set forth in claim 1, wherein said step of modifying an existing controller input sequence comprises integrating additional test hardware into the RTL circuit from which the untested RTL elements have been selected.

7. The method set forth in claim 1, further comprising the steps of:

determining whether RTL modules within the RTL circuit are random-pattern testable; and boosting the random pattern testability of an RTL module that has been determined to be random-pattern resistant.

8. The method set forth in claim 7, wherein said step of boosting random pattern testability of an RTL module comprises adding extra control/observation points to the determined random-pattern resistant RTL module.

* * * * *